(12) United States Patent
Lee et al.

(10) Patent No.: US 12,532,576 B2
(45) Date of Patent: Jan. 20, 2026

(54) LIGHTING DEVICE AND LAMP COMPRISING SAME

(71) Applicant: LG INNOTEK CO., LTD., Seoul (KR)

(72) Inventors: Dong Hyun Lee, Seoul (KR); Kwang Hyun Ko, Seoul (KR); Moo Ryong Park, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 374 days.

(21) Appl. No.: 18/270,940

(22) PCT Filed: Jan. 11, 2022

(86) PCT No.: PCT/KR2022/000424
§ 371 (c)(1),
(2) Date: Jul. 5, 2023

(87) PCT Pub. No.: WO2022/154422
PCT Pub. Date: Jul. 21, 2022

(65) Prior Publication Data
US 2024/0055553 A1 Feb. 15, 2024

(30) Foreign Application Priority Data
Jan. 14, 2021 (KR) .................. 10-2021-0005082

(51) Int. Cl.
*H10H 20/814* (2025.01)
*H10H 20/821* (2025.01)
(Continued)

(52) U.S. Cl.
CPC ........ *H10H 20/814* (2025.01); *H10H 20/821* (2025.01); *H10H 20/854* (2025.01); *H10H 20/855* (2025.01); *H10H 29/142* (2025.01)

(58) Field of Classification Search
CPC .. H10H 20/814; H10H 20/821; H10H 29/142; H10H 20/854; H10H 20/855
(Continued)

(56) References Cited

U.S. PATENT DOCUMENTS

| | | |
|---|---|---|
| 8,061,867 B2 | 11/2011 | Kim et al. |
| 8,128,256 B2 | 3/2012 | Kim et al. |

(Continued)

FOREIGN PATENT DOCUMENTS

| | | |
|---|---|---|
| CN | 101994940 | 3/2011 |
| CN | 103411167 | 11/2013 |

(Continued)

OTHER PUBLICATIONS

International Search Report dated May 13, 2022 issued in Application No. PCT/KR2022/000424.
(Continued)

*Primary Examiner* — James R Greece
*Assistant Examiner* — Hana S Featherly
(74) *Attorney, Agent, or Firm* — KED & ASSOCIATES, LLP

(57) ABSTRACT

The lighting device disclosed in the embodiment includes a substrate, a light source portion disposed on the substrate, a resin layer disposed on the substrate and covering the light source portion, a light blocking layer disposed on the resin layer and having an opening portion, and an optical layer disposed on the light blocking layer, wherein the light source portion includes a plurality of first light sources disposed in a first region of the resin layer and a plurality of second light sources disposed in a second area of the resin layer, wherein the resin layer includes a groove disposed between the first and second regions.

20 Claims, 21 Drawing Sheets

(51) Int. Cl.
   *H10H 20/854* (2025.01)
   *H10H 20/855* (2025.01)
   *H10H 29/14* (2025.01)
(58) Field of Classification Search
   USPC .......................................................... 313/500
   See application file for complete search history.

(56) References Cited

U.S. PATENT DOCUMENTS

| | | | |
|---|---|---|---|
| 8,240,877 B2 | 8/2012 | Kim et al. | |
| 8,356,915 B2 | 1/2013 | Kim et al. | |
| 8,408,738 B2 | 4/2013 | Kim et al. | |
| 8,449,138 B2 | 5/2013 | Kim et al. | |
| 8,534,865 B2 | 9/2013 | Kim et al. | |
| 8,556,444 B2 | 10/2013 | Kim et al. | |
| 8,899,781 B2 | 12/2014 | Kim et al. | |
| 8,933,871 B2 | 1/2015 | Park et al. | |
| 8,960,977 B2 | 2/2015 | Yang et al. | |
| RE45,805 E | 11/2015 | Kim et al. | |
| 9,429,278 B2 | 8/2016 | Kim et al. | |
| 9,541,696 B2 | 1/2017 | Yang et al. | |
| 9,741,700 B2 | 8/2017 | Kim | |
| 9,822,953 B2 * | 11/2017 | Park | F21V 7/005 |
| 10,228,504 B2 | 3/2019 | Yang et al. | |
| 10,422,505 B2 | 9/2019 | Lee et al. | |
| 10,563,840 B2 | 2/2020 | Lee et al. | |
| 10,670,794 B2 | 6/2020 | Yang et al. | |
| 10,738,970 B2 | 8/2020 | Lee et al. | |
| 2011/0043132 A1 | 2/2011 | Kim et al. | |
| 2011/0044023 A1 | 2/2011 | Kim et al. | |
| 2011/0044024 A1 | 2/2011 | Kim et al. | |
| 2011/0050558 A1 | 3/2011 | Park et al. | |
| 2011/0157890 A1 | 6/2011 | Kim et al. | |
| 2011/0176306 A1 | 7/2011 | Kim et al. | |
| 2011/0188246 A1 | 8/2011 | Kim et al. | |
| 2011/0222279 A1 | 9/2011 | Kim et al. | |
| 2012/0039067 A1 | 2/2012 | Kim et al. | |
| 2013/0169905 A1 | 7/2013 | Ouchi et al. | |
| 2014/0003028 A1 | 1/2014 | Kim et al. | |
| 2015/0077992 A1 | 3/2015 | Kim et al. | |
| 2020/0159078 A1 | 5/2020 | Watanabe et al. | |

FOREIGN PATENT DOCUMENTS

| | | |
|---|---|---|
| EP | 2541290 | 1/2013 |
| EP | 2470949 | 11/2015 |
| JP | 2009-206064 | 9/2009 |
| JP | 2013-012422 | 1/2013 |
| JP | 2013-503431 | 1/2013 |
| JP | 2014-038845 | 2/2014 |
| JP | 2018-536263 | 12/2018 |
| KR | 10-2010-0038503 | 4/2010 |
| KR | 10-2015-0041317 | 4/2015 |
| KR | 10-2016-0139274 | 12/2016 |
| KR | 10-2020-0080063 | 7/2020 |
| KR | 10-2020-0139615 | 12/2020 |
| TW | 2012-40183 | 10/2012 |
| TW | 2012-43211 | 11/2012 |
| WO | WO 2011/025172 | 3/2011 |

OTHER PUBLICATIONS

European Search Report dated Oct. 18, 2024 issued in Application No. 22739617.3.
Taiwanese Office Action dated Oct. 28, 2023 issued in Application No. 111100821.
Taiwanese Office Action dated Dec. 20, 2023 issued in Application No. 112127411.
Japanese Office Action dated Jul. 15, 2025, issued in Application No. 2023-541831.

* cited by examiner

ND LAMP# LIGHTING DEVICE AND LAMP
COMPRISING SAME

CROSS-REFERENCE TO RELATED PATENT APPLICATIONS

This application is a U.S. National Stage Application under 35 U.S.C. § 371 of PCT Application No. PCT/KR2022/000424, filed Jan. 11, 2022, which claims priority to Korean Patent Application No. 10-2021-0005082, filed Jan. 14, 2021, whose entire disclosures are hereby incorporated by reference.

TECHNICAL FIELD

The embodiment relates to a lighting device capable of providing a stereoscopic image and a lamp including the same.

BACKGROUND ART

Lighting is a device that may supply light or control the amount of light and is used in various fields. For example, the lighting device may be applied to various fields such as vehicles and buildings to illuminate the interior or exterior. Recently, a light emitting device has been used as a light source for lighting. Such a light emitting device, for example, a light emitting diode (LED), has advantages such as low power consumption and semi-permanent lifespan, fast response speed, safety, environmental friendliness, and the like, compared to conventional light sources such as fluorescent lamps and incandescent lamps. These light emitting diodes are being applied to various optical assemblies such as various display devices, indoor lights, or outdoor lights. In general, lamps of various colors and shapes are applied to vehicles, and recently, lamps employing light emitting diodes as light sources for vehicles have been proposed. For example, light emitting diodes are being applied to vehicle headlights, tail lights, turn signals, and the like. However, such a light emitting diode has a problem in that the exit angle of the emitted light is relatively small. For this reason, when the light emitting diode is used as a vehicle lamp, there is a demand for increasing the light emitting area of the lamp.

When the lamp includes the light emitting diode, there is a problem in that the performance of the light emitting diode is deteriorated or the uniformity of emitted light is reduced due to heat generated when the light emitting diode emits light, and there is a problem that hot spots are formed by the light emitted from the light emitting diode. In this case, when the surface light source is implemented using the lamp, there is a problem in that the uniformity characteristic of the light emitting surface is deteriorated. In general, when the light emitting diode is applied to a vehicle lamp, there is a problem that the light emitting diode is visually recognized from the outside. For example, when the vehicle lamp is turned on, it may not be visually recognized by the light emitted from the light source. There is a problem in that the characteristics are deteriorated. Since the light emitting diode emits light in the form of a point light source and is matched with one light emitting diode per individual image of three-dimensional lighting, a plurality of light emitting diodes are also required to implement all of the plurality of individual images. In addition, when the same light emitting diode is used, since the widths of individual images of stereoscopic illumination are the same, there is a problem in that diversity of images cannot be expressed. For this reason, when a light emitting diode is used as a vehicle lamp, there is a limit in reducing the number of light emitting diodes and realizing various images. Accordingly, there is a need for a new lighting device and lamp capable of solving the above problems.

DISCLOSURE

Technical Problem

Embodiments are intended to provide a lighting device and a lamp capable of providing a uniform point light source through an opening portion. An embodiment is to provide a lighting device and a lamp capable of providing one or a plurality of stereoscopic images. An embodiment is to provide a lighting device and a lamp capable of providing a stereoscopic image having various shapes.

Technical Solution

A lighting device according to an embodiment includes a substrate, a light source portion disposed on the substrate, a resin layer disposed on the substrate and covering the light source portion, a light blocking layer disposed on the resin layer and having an opening portion, and an optical layer disposed on the light blocking layer, wherein the light source portion includes a plurality of first light sources disposed in a first region of the resin layer and a plurality of second light sources disposed in a second region of the resin layer, wherein the resin layer includes a groove disposed between the first and second regions.

According to an embodiment of the invention, wherein the resin layer may include first and second side surfaces facing in a second direction, and third and fourth side surfaces facing in a first direction, wherein the first direction is orthogonal to the second direction, wherein a light emitting surface of each of the plurality of first light sources may face the first side surface of the resin layer. The plurality of first light sources may be disposed between the first side surface of the resin layer and the groove, and the plurality of second light sources may be disposed between the second side surface of the resin layer and the groove.

According to an embodiment of the invention, the resin layer is disposed between the first and second regions and includes a connection portion connecting the first and second regions, and a length in the first direction of the connection portion is 2 mm or more.

According to an embodiment of the invention, the plurality of first light sources is spaced apart from each other in a first direction, the plurality of second light sources is spaced apart from each other in the first direction. The plurality of first light sources may be arranged in a row, and the plurality of second light sources may be arranged in a row.

According to an embodiment of the invention, a length of the groove in the first direction is longer than a length in the first direction of a region in which the plurality of first light sources are disposed, and the length of the first direction in a region in which the plurality of first light sources is disposed may be defined as a length in the first direction from one end of a light source arranged first among the plurality of first light sources to the other end of a light source arranged last. The opening portion may include a plurality of first openings arranged with regularity and a plurality of second openings having regularity and spaced apart from the plurality of first openings. Each of the plurality of second openings may be disposed in regions corresponding to the plurality of first openings in the second direction. Each of the plurality of second openings may be disposed in a region corresponding to a region between the plurality of first openings spaced apart from each other in the first direction and in the second direction. The opening portion may include a plurality of third openings disposed in a central region of the light blocking layer, and the plurality of third openings may overlap the groove in a vertical direction, wherein the vertical direction may be orthogonal to the first and second directions.

A lighting device according to an embodiment includes a substrate, a light source portion disposed on the substrate, a resin layer disposed on the substrate and covering the light source portion, a light blocking layer disposed on the resin layer and having an opening portion, and an optical layer disposed on the light blocking layer, wherein the opening portions include a plurality of first openings arranged with regularity, and the light emitted from the light source portion is transmitted to the optical layer through the plurality of first openings, and may pass through the optical layer and be emitted to the outside.

According to an embodiment of the invention, the light source portion may include a plurality of first light sources disposed in the first region of the resin layer, and the number of the plurality of first openings may be greater than the number of the plurality of first light sources. According to an embodiment of the invention, at least one of the plurality of first openings includes a first unit opening, a third unit opening spaced apart from the first unit opening in a first direction, and a second unit opening disposed between the first and third unit openings and connecting the first and third unit openings, wherein a lengths in the first direction of each of the first to third unit openings are the same as each other, and wherein a length of the second unit opening is greater than a length of the first unit opening and a length of the third unit opening is greater than a length of the second unit opening in a second direction, and the second direction may be a direction perpendicular to the first direction.

According to an embodiment of the invention, the resin layer may include a second region spaced apart from the first region, a groove disposed between the first and second regions, and a connection portion disposed between the first and second regions connecting the first and second regions.

According to an embodiment of the invention, the opening portion includes a plurality of second openings arranged with regularity, and the plurality of second openings is disposed in a region between the plurality of first openings spaced apart from each other in a first direction and a region corresponding to a second direction, and the second direction may be a direction perpendicular to the first direction. A virtual straight line connecting the centers of the plurality of first openings may be included, and lengths in the second direction between each of the plurality of second openings and the virtual straight line may be different from each other. The length in the second direction between each of the plurality of second openings and the virtual straight line increases may decrease so as to be adjacent to a 2-nth light source disposed last from a 2-1 light source disposed first among the plurality of second light sources. The opening portion may further include a third opening disposed in a central region of the light blocking layer. The light emitted from the light source portion may be transmitted to the optical layer through the opening portion, and a light pattern formed through the optical layer may include a linear shape.

According to an embodiment of the invention, a reflective layer disposed between the substrate and the resin layer may be further included, and the reflective layer may overlap the opening portion in a vertical direction.

According to an embodiment of the invention, the opening portion may not overlap the light source portion in a vertical direction. The opening portion may partially overlap the light source portion in a vertical direction. According to an embodiment of the invention, the light blocking layer and the optical layer may be spaced apart.

The lighting device according to the embodiment includes a substrate, a light source portion disposed on the substrate, a resin layer disposed on the substrate and covering the light source portion, a light blocking layer disposed on the resin layer and including an opening portion, and an optical layer disposed on the light blocking layer, wherein the optical layer includes a plurality of optical patterns having long axes in a direction of the light emitting surface of the light source portion, the opening portion include a plurality of openings, and the light emitted from the light source portion is incident on the optical layer through the opening portion, and the light pattern formed through the optical may include a linear shape, and the number of the linear shapes may be less than or equal to the number of the plurality of openings.

According to an embodiment of the invention, the linear shape may include a curve, and the width of the light pattern having the linear shape may vary according to the width of the opening portion. According to an embodiment of the invention, the opening portion may include a plurality of first openings arranged in a first direction with regularity, and a plurality of second openings having regularity and arranged in the first direction. The plurality of second openings may be disposed in regions corresponding to the plurality of first openings in a second direction, and the second direction may be perpendicular to the first direction. The plurality of second openings may be disposed in a region between the plurality of first openings spaced apart in a first direction and a region corresponding to the second direction, and the second direction may be a direction perpendicular to the first direction. The first direction length of at least one first opening of the plurality of first openings may be greater than the first direction length of at least one second opening of the plurality of second openings.

According to an embodiment of the invention, the light emitted from the light source portion is transmitted to the optical layer through the first opening, and the light pattern formed through the optical layer has a form extending from one side of the resin layer adjacent to the first opening to the other side opposite to the one side, and in the optical pattern, the width in the first direction of the region adjacent to the one side of the resin layer may be greater than the width in the first direction of the region adjacent to the other side of the resin layer.

According to an embodiment of the invention, the opening portion includes at least third opening disposed in a region between the first and second openings and disposed in a central region of the light blocking layer, and a portion of the light emitted from the light source portion may be transmitted to the optical layer through the third opening, and a light pattern formed through the optical layer may have a symmetrical shape with respect to a central region of the light blocking layer. The third opening may be disposed in a region between the plurality of first openings spaced apart in a first direction and a region corresponding to the second direction, and the second direction may be a direction perpendicular to the first direction.

Advantageous Effects

The lighting device and lamp according to the embodiment may provide one or a plurality of stereoscopic images.

In detail, the lighting device may include the lighting module and an optical layer disposed on the lighting module. In addition, the lighting module may include one or a plurality of opening portions, and light emitted through the opening portions may be provided as a stereoscopic image having one or more linear shapes through the optical layer. In addition, the lighting device and the lamp according to the embodiment may provide a stereoscopic image having various shapes. In detail, the lighting device according to the embodiment may control the number, shape, size, location, etc. of the opening portions. Accordingly, the stereoscopic image passing through the optical layer may have various widths, lengths, luminance, and shapes.

The lighting device and the lamp according to the embodiment may have improved light characteristics. In detail, the lighting device and the lamp may include a lighting module including a light source portion and a resin layer sealing the light source portion, and the resin layer may effectively guide the light emitted from the light source portion. Accordingly, the lighting module may provide light having a uniform intensity. In particular, the lighting device according to the embodiment may provide a uniform surface light source in the direction of the upper surface of the lighting module. Accordingly, the lighting module may emit a point light source having a uniform intensity through the opening portions regardless of the number and positions of the opening portions.

The resin layer of the lighting device according to the embodiment may include a groove extending in one direction between the plurality of light sources. In this case, the groove may be longer than a length in one direction in which the plurality of light sources is disposed. That is, the groove may separate the regions of the resin layer, and may prevent or minimize the movement of light guided in each region of the resin layer to another region. Accordingly, the lighting device may prevent light from a plurality of regions from being mixed, thereby providing a stereoscopic image more clearly.

The lighting device according to the embodiment may have a thickness in which components included therein are set. Accordingly, the lighting device may be provided in a flexible form, and may be applied to a housing, a bracket, or the like of a lamp having various curved shapes.

BEST MODE

Figure 1:
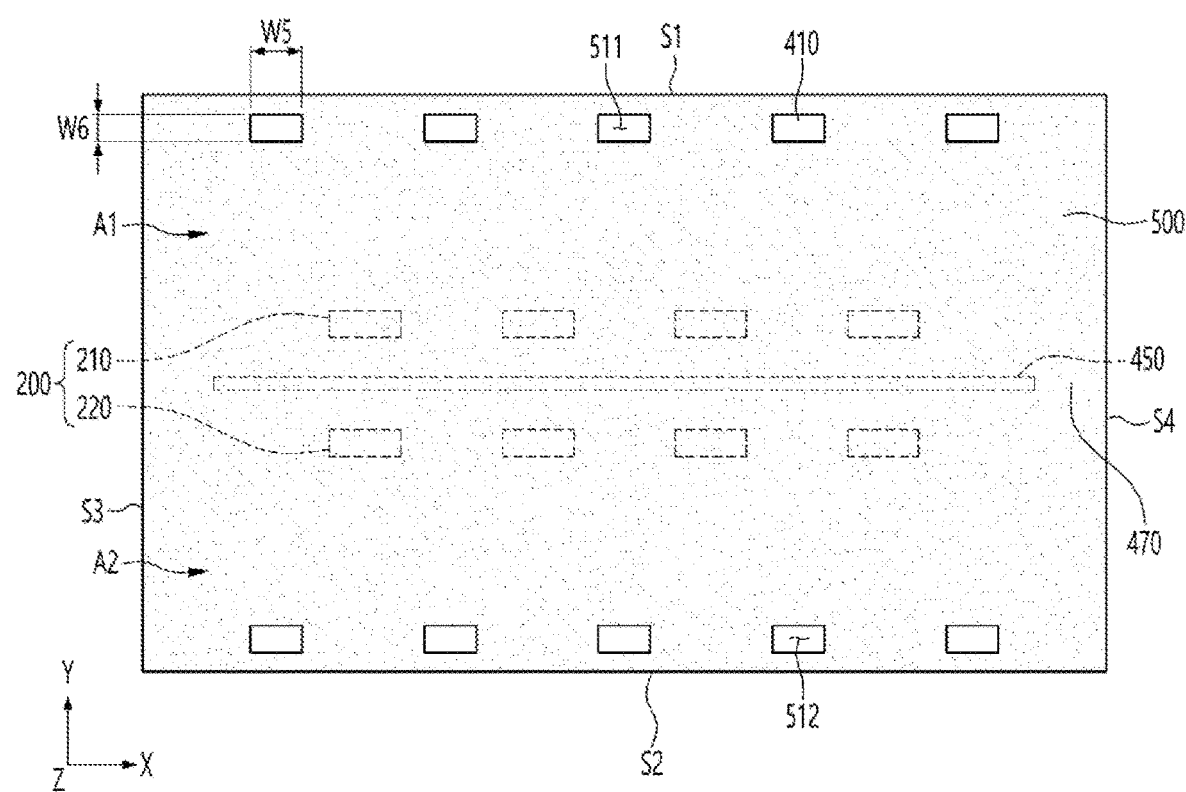
FIG. 1 is a top view of a lighting device according to an embodiment.

Hereinafter, preferred embodiments of the invention will be described in detail with reference to the accompanying drawings.

A technical spirit of the invention is not limited to some embodiments to be described, and may be implemented in various other forms, and one or more of the components may be selectively combined and substituted for use within the scope of the technical spirit of the invention. In addition, the terms (including technical and scientific terms) used in the embodiments of the invention, unless specifically defined and described explicitly, may be interpreted in a meaning that may be generally understood by those having ordinary skill in the art to which the invention pertains, and terms that are commonly used such as terms defined in a dictionary should be able to interpret their meanings in consideration of the contextual meaning of the relevant technology. Further, the terms used in the embodiments of the invention are for explaining the embodiments and are not intended to limit the invention. In this specification, the singular forms also may include plural forms unless otherwise specifically stated in a phrase, and in the case in which at least one (or one or more) of A and (and) B, C is stated, it may include one or more of all combinations that may be combined with A, B, and C. In describing the components of the embodiments of the invention, terms such as first, second, A, B, (a), and (b) may be used. Such terms are only for distinguishing the component from other component, and may not be determined by the term by the nature, sequence or procedure etc. of the corresponding constituent element. And when it is described that a component is "connected", "coupled" or "joined" to another component, the description may include not only being directly connected, coupled or joined to the other component but also being "connected", "coupled" or "joined" by another component between the component and the other component. In addition, in the case of being described as being formed or disposed "above (on)" or "below (under)" of each component, the description includes not only when two components are in direct contact with each other, but also when one or more other components are formed or disposed between the two components. In addition, when expressed as "above (on)" or "below (under)", it may refer to a downward direction as well as an upward direction with respect to one element.

The lighting device according to the invention may be applied to various lamp devices that require lighting, such as a vehicle lamp, a home optical assembly, and an industrial optical assembly. For example, when applied to a vehicle lamp, it is applicable to a head lamp, a side mirror lamp, a side maker light, a fog lamp, a tail lamp, a brake lamp, a daytime running lamp, a vehicle interior lighting, a door scar, the rear combination lamps, backup lamps, etc. In addition, when applied to a vehicle lamp, it is applicable to a rear side assist system (BSD) disposed on a side mirror or an A-Pillar. In addition, the optical assembly of the invention may be applied to indoor and outdoor advertising devices, display devices, and various electric vehicle fields.

In the description of the embodiment of the invention, the first direction may mean the x-axis direction shown in the drawings, the second direction may mean the y-axis direction shown in the drawings, and the third direction may mean the z-axis direction shown in the drawings. Also, the horizontal direction may mean first and second directions, and the vertical direction may mean a third direction in a direction perpendicular to at least one of the first and second directions. For example, the horizontal direction may mean the x-axis and y-axis directions of the drawing, and the vertical direction may be a z-axis direction of the drawing and a direction perpendicular to the x-axis and y-axis directions.

Figure 2:
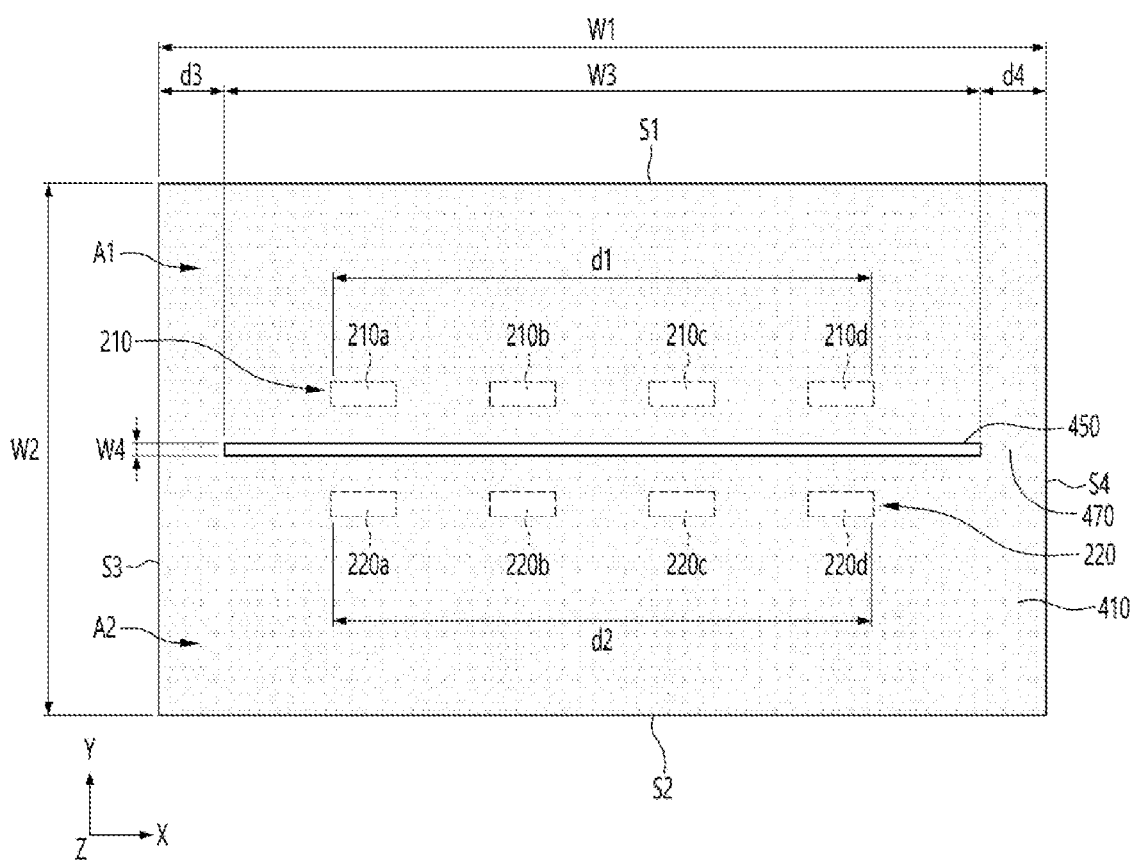
FIG. 2 is a top view of a resin layer of a lighting device according to an embodiment.
Figure 3:
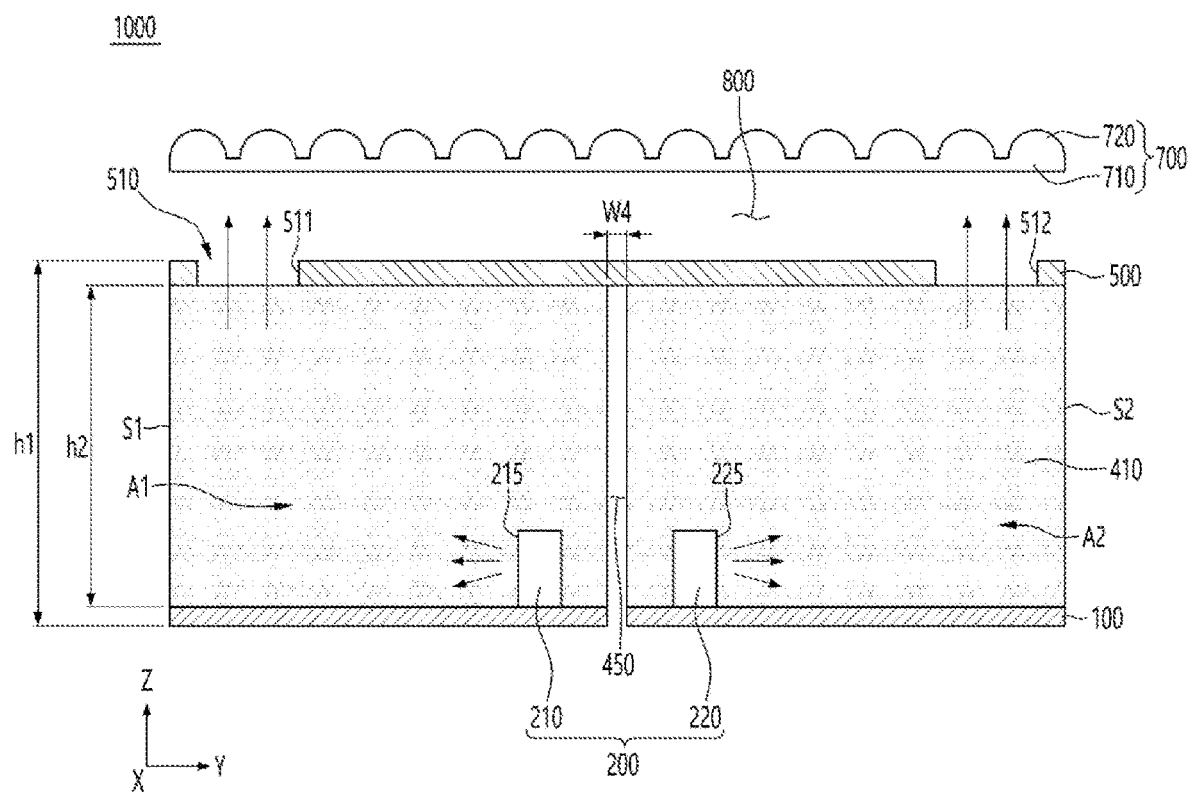
FIG. 3 is a cross-sectional view of a lighting device according to an embodiment.
Figure 4:
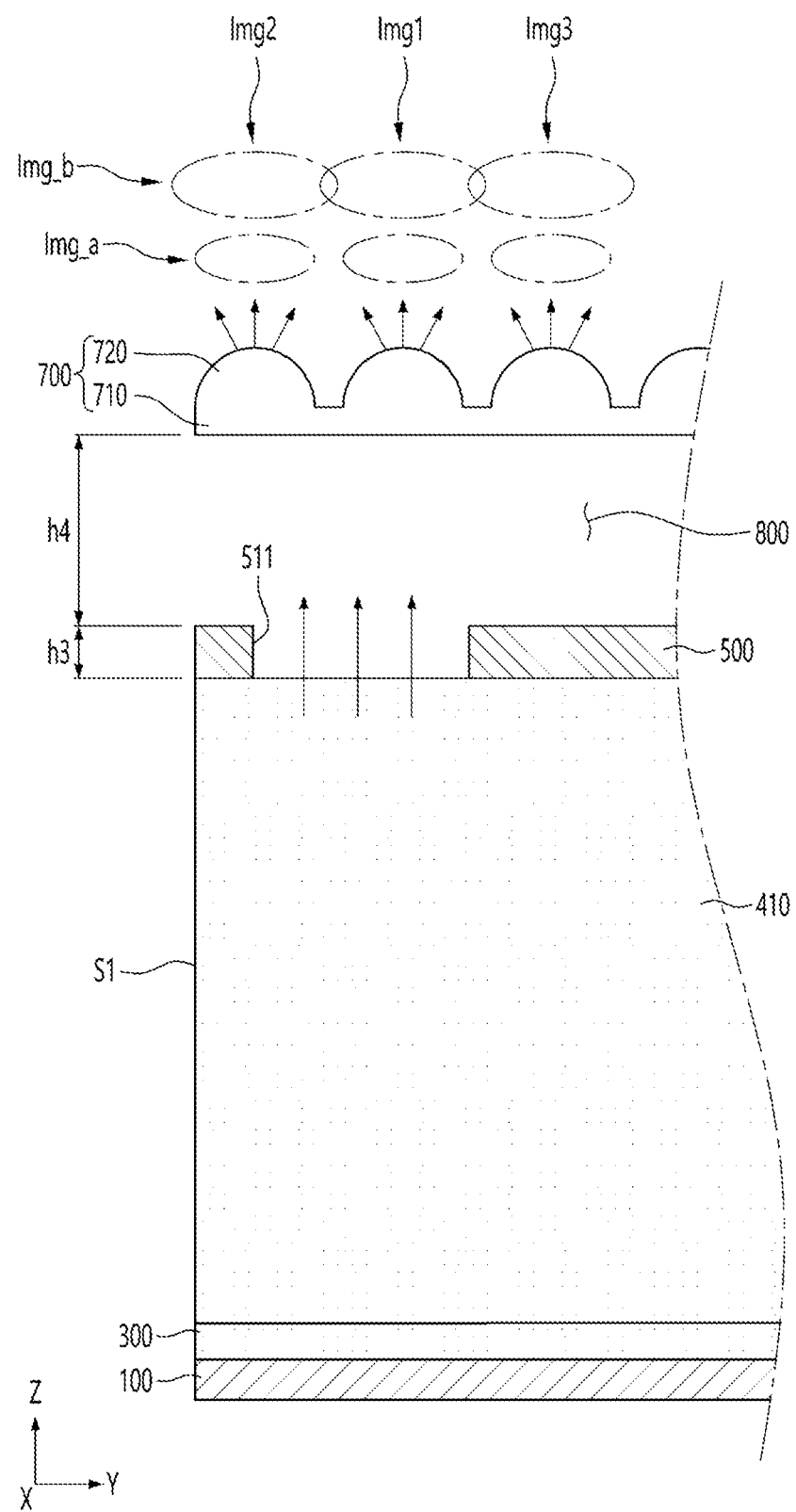
FIG. 4 is an enlarged cross-sectional view of an area of FIG. 3.
Figure 5:
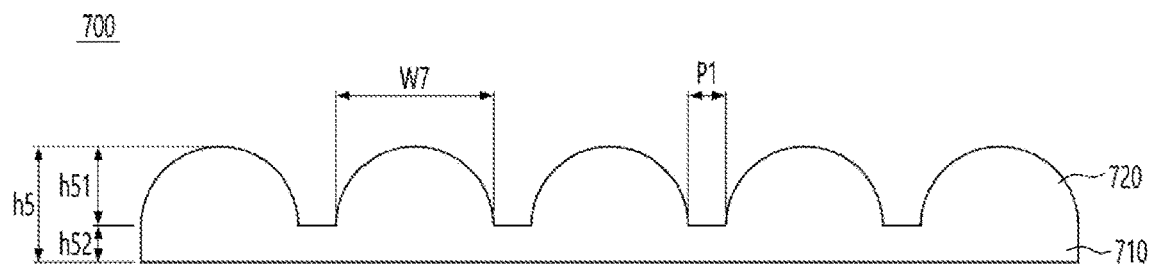
FIG. 5 is a cross-sectional view of an optical layer of a lighting device according to an embodiment.
Figure 5:
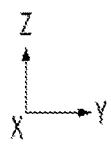

FIG. 1 is a top view of a lighting device according to an embodiment, and FIG. 2 is a top view of a resin layer of the lighting device according to the embodiment. FIG. 3 is a cross-sectional view of a lighting device according to an embodiment, FIG. 4 is an enlarged cross-sectional view of an area of FIG. 3, and FIG. 5 is a cross-sectional view of an optical layer of the lighting device according to the embodiment.

Referring to FIGS. 1 to 5, the lighting device 1000 according to the embodiment may include a lighting module including a substrate 100, a light source portion 200, a resin layer 410, and a light blocking layer 500, and an optical layer 700 disposed on the lighting module. The lighting module may provide light from a point light source having a uniform point intensity. For example, light emitted from the light source portion 200 and passed through the resin layer 410 may emit light in the form of a surface light source having a uniform intensity. In this case, the light blocking layer 500 including one or a plurality of openings may be disposed on the resin layer 410. Accordingly, the light passing through the resin layer 410 and passing through the light blocking layer 500 may emit light in the form of a point light source corresponding to the opening portion and having a uniform intensity. Thereafter, the point light source may be transmitted to the optical layer 700 disposed on the lighting module, and the light passing through the optical layer 700 may be emitted in the form of a stereoscopic image or a three-dimensional image. In this case, the stereoscopic image is an image recognized when a person sees it from the outside of the lighting device 1000, and is implemented as a contrast between the brightest region and the darkest region, or may be given a three-dimension effect in three-dimensional form by using the depth or difference of luminous intensity.

The lighting module may have a set thickness. The thickness of the lighting module may be about 5 mm or less in the third direction (z-axis direction) from the lower surface of the substrate 100 to the upper surface of the light blocking layer 500. In detail, the thickness of the lighting module may be about 2 mm to about 5 mm. When the thickness of the lighting module is less than about 2 mm, the reliability of the lighting module may be deteriorated. In addition, when the thickness of the lighting module exceeds about 5 mm, it may be difficult to provide the lighting module in a flexible form, and thus it may be difficult to apply the lighting module to a housing, a bracket, etc. of a lamp having various curved shapes.

Hereinafter, the configurations of the lighting device 1000 will be described in more detail.

The substrate 100 may include a printed circuit board (PCB) having wiring. The substrate 100 may include, for example, a resin-based printed circuit board (PCB), a metal core PCB, a flexible PCB, a non-flexible PCB, a ceramic PCB, or an FR-4 substrate. A wiring layer (not shown) may be disposed on the substrate 100. The wiring layer may be electrically connected to the light source portion 200. For example, when the light source portion 200 includes a plurality of light sources, the plurality of light sources may be connected in series, parallel, or series-parallel by the wiring layer. The substrate 100 may be disposed under the light source portion 200 and the resin layer 410 to perform functions of a base member and a support member. The substrate 100 may have a thickness of about 100 μm to about 2 mm. In detail, the substrate 100 may have a thickness of about 150 μm to about 1.8 mm. In more detail, the substrate 100 may have a thickness of about 200 μm to about 1.6 mm. When the substrate 100 has a thickness of less than about 100 μm, it may be difficult to effectively support a configuration disposed on the substrate 100, for example, the light source portion 200, the resin layer 410, and the like. In addition, since the thickness of the substrate 100 is too thin, a problem in which reliability is deteriorated may occur. In addition, when the thickness of the substrate 100 exceeds about 2 mm, the overall thickness of the lighting device 1000 may increase, and the flexibility of the substrate 100 may decrease. Accordingly, the substrate 100 preferably satisfies the above-described range.

The substrate 100 may further include a connector (not shown) disposed on a part thereof. The substrate 100 may provide power applied through the connector to the light source portion 200. The connector may be formed in at least one of an upper surface and a lower surface of the substrate 100. For example, when the connector is disposed on the upper surface on which the light source portion 200 and the resin layer 410 are disposed, the connector may be disposed on a region of the substrate 100 where the resin layer 410 is not disposed. Alternatively, when the connector is disposed on the lower surface of the substrate 100, and the resin layer 410 may be disposed on the entire region of the upper surface of the substrate 100 or a region of 80% or more.

The light source portion 200 may be disposed on the substrate 100. For example, the light source portion 200 may be disposed on the upper surface of the substrate 100 facing the light blocking layer 500. The light source portion 200 may emit light in at least one direction. The light source portion 200 may emit light in a lateral direction of the resin layer 410. The light source portion 200 includes an LED chip and is provided in a side view type package, and the light emitting surface of the light source portion 200 may face the side surface of the resin layer 410. In this case, the LED chip may include at least one of a blue LED chip, a red LED chip, and a green LED chip. Each of the packages may include an LED chip having one color, a plurality of LED chips having the same color, or a plurality of LED chips having different colors.

The light source portion 200 may include a first light source 210 and a second light source 220. The first light source 210 may be disposed in the first region A1 of the resin layer 410. The first light source 210 may be disposed to face the first side surface S1 of the resin layer 410. In detail, the first light source 210 may be disposed such that the light emitting surface of the first light source 210 faces the first side surface S1 of the resin layer 410. The first light source 210 may emit light toward the first side surface S1. A plurality of the first light sources 210 may be provided on the substrate 100. The plurality of first light sources 210 may be spaced apart from each other and arranged in a row on the substrate 100. For example, the plurality of first light sources 210 are spaced apart from each other in the first direction (x-axis direction), are arranged in a row as shown in the drawing and may include a 1-1 light sources 210a and 1-2 light sources 210b, a 1-3 th light source 210c and a 1-4 th light source 210d. In this case, the 1-1 light source 210a may be a first light source 210 disposed first among the first light sources 210, and the 1-4 light source 210d may be the first light source disposed last among the first light source 210.

The second light source 220 may be disposed in a second region A2 spaced apart from the first region A1 of the resin layer 410. The second region A2 may be a region spaced apart from the first region A1 in a second direction (y-axis direction). The second light source 220 may be disposed to face a side surface different from the first side surface S1 of the resin layer 410. The second light source 220 may be disposed to face the first side surface S1 and the second side surface S2 of the resin layer 410 facing the second direction (y-axis direction). In detail, the second light source 220 may be disposed such that the light emitting surface of the second light source 220 faces the second side surface S2 of the resin layer 410. The second light source 220 may emit light toward the second side surface S2.

A plurality of second light sources 220 may be provided on the substrate 100. The second light source 220 may be provided in the same number as the first light source 210. The second light sources 220 may be spaced apart from each other and arranged in a row on the substrate 100. For example, the plurality of second light sources 220 are spaced apart from each other in the first direction, and may include a 2-1 light source 220a, a 2-2 light source 220b, a 2-3 light source 220c, and a 2-4 light source 220d which are arranged in a row as shown in the drawing. In this case, the 2-1 light source 220a may be a second light source 220 disposed first among the second light sources 220, and the 2-4 light source 220d may be the second light source disposed last among the second light sources 220. However, the embodiment is not limited thereto, and the number of the plurality of second light sources 220 may be greater or less than the number of the first light sources 210. The plurality of second light sources 220 may be disposed in regions corresponding to the plurality of first light sources 210. For example, the plurality of second light sources 220 may be disposed in regions corresponding to the plurality of first light sources 210 in the second direction (y-axis direction). Alternatively, the plurality of second light sources 220 may be disposed in a region between the plurality of first light sources 210 spaced apart from each other in the first direction and a region corresponding to the second direction. That is, when viewed from the top, the first light source 210 and the second light source 220 may be arranged in a zigzag shape.

The plurality of first light sources 210 and the plurality of second light sources 220 may simultaneously emit light. For example, when power is applied to the light source portion 200, the plurality of first light sources 210 may emit light toward the first side surface S1, and the plurality of second light sources 220 may emit light toward the second side surface S2. Alternatively, the first light source 210 and the second light source 220 may independently emit light. For example, when power is applied to the light source portion 200, only one light source selected from the first light source 210 or the second light source 220 may emit light toward the side surface of the resin layer 410 corresponding thereto. Alternatively, light sources included in each of the plurality of first light sources 210 and the plurality of second light sources 220 may independently emit light. For example, when power is applied to the light source portion 200, each of the plurality of first light sources 210 and each of the plurality of second light sources 220 may independently emit light. Accordingly, the lighting device 1000 according to the embodiment may completely or selectively control the plurality of light sources included in the light source portion 200, thereby providing a stereoscopic image capable of providing various shapes and various motions.

The resin layer 410 may be disposed on the substrate 100. The resin layer 410 may be disposed on the upper surface of the substrate 100. The resin layer 410 may be disposed on the entire upper surface or a partial region of the substrate 100. The resin layer 410 may be formed of a transparent material. The resin layer 410 may include a resin material such as silicone or epoxy. The resin layer 410 may include a thermosetting resin material, for example, may selectively include PC, OPS, PMMA, PVC, and the like. The resin layer 410 may be formed of glass, but is not limited thereto. For example, the main material of the resin layer 410 may be a resin material having a urethane acrylate oligomer as a main material. For example, a mixture of urethane acrylate oligomer, which is a synthetic oligomer, and a polymer type, which is polyacrylic, may be used. Of course, the low-boiling dilution-type reactive monomer IBOA (isobornyl acrylate), HPA (Hydroxylpropyl acrylate, 2-HEA (2-hydroxyethyl acrylate), etc. may further include a mixed monomer, etc., as an additive, a photoinitiator (for example, 1-hydroxy cyclohexyl phenyl-ketone, etc.) or antioxidants may be mixed.

Since the resin layer 410 is provided as a layer for guiding light as a resin, it may be provided with a thinner thickness than that of glass and may be provided as a flexible plate. The resin layer 410 may emit the point light source emitted from the light source portion 200 in the form of a line light source or a surface light source. The upper surface of the resin layer 410 may emit light by diffusing the light emitted from the light source portion 200. For example, beads (not shown) may be included in the resin layer 410, and the beads may diffuse and reflect incident light to increase the amount of light. The beads may be disposed in an amount of 0.01 to 0.3% based on the weight of the resin layer 410. The bead may be composed of any one selected from silicon, silica, glass bubble, polymethyl methacrylate (PMMA), urethane, Zn, Zr, $Al_2O_3$, and acryl, and the particle diameter of the beads may be in the range of about 1 μm to about 20 μm, but is not limited thereto.

The resin layer 410 may have lengths W1 and W2 in first and second directions (x-axis and y-axis). For example, the length W1 in the first direction of the resin layer 410 may be greater than or equal to the length W2 in the second direction. For example, when the first and second light sources 210 and 220 are arranged in a row in the first direction, the first direction length W1 of the resin layer 410 may be greater than the second direction W2 length. The resin layer 410 may have a set thickness (third direction, or z-axis direction). The resin layer 410 may be 4 mm or less. When the thickness h2 of the resin layer 410 is less than about 0.5 mm, the light sources are exposed on the upper surface of the resin layer 410. In detail, the thickness h2 of the resin layer 410 may be about 0.5 mm to about 4 mm. In more detail, the thickness h2 of the resin layer 410 may be about 1 mm to about 4 mm. In more detail, the thickness h2 of the resin layer 410 may be about 1.4 mm to 4 mm, and may effectively guide the light to be emitted from the light source portion 200. In addition, when the thickness h2 of the resin layer 410 exceeds about 4 mm, the overall optical path may increase. Accordingly, light loss may occur while the light emitted from the light source portion 200 is emitted. Accordingly, the thickness h2 of the resin layer 410 preferably satisfies the above-described range.

The resin layer 410 may be disposed to surround the light source portion 200. The resin layer 410 may seal the light source portion 200. The resin layer 410 may protect the light source portion 200 and may prevent or minimize loss of light emitted from the light source portion 200. The resin layer 410 may contact the surface of the light source portion 200 and may contact the light emitting surface of the light source portion 200. Also, the resin layer 410 may be in contact with the upper surface of the substrate 100. That is, the resin layer 410 may support the substrate 100 and the light source portion 200, and may support the light source portion 200 to be disposed at a set position.

The resin layer 410 may include a plurality of side surfaces. For example, the resin layer 410 may include a first side surface S1 and a second side surface S2. The first side surface S1 may be disposed closer to the first light source 210 than the second light source 220. The first side surface S1 may face the light emitting surface of the first light source 210. The second side surface S2 may be a side facing the first side surface S1. For example, the second side surface S2 may face the first side surface S1 in a second direction (y-axis direction). The second side surface S2 may be disposed closer to the second light source 220 than the first light source 210. The second side surface S2 may face the light emitting surface of the second light source 220. The first side surface S1 and the second side surface S2 may be provided as a flat surface or a curved surface. Also, the first side surface S1 and the second side surface S2 may be spaced apart from each other at a set interval. For example, an interval in the second direction (y-axis direction) between the first side surface S1 and the second side surface S2 may be constant. That is, the first side surface S1 and the second side surface S2 may be parallel. Also, an interval in a second direction between the first side surface S1 and the second side surface S2 may be changed. For example, the interval in the second direction between the first side surface S1 and the second side surface S2 may gradually increase or decrease in the first direction, or may increase and decrease in a wave shape. The plurality of side surfaces of the resin layer 410 may include a third side surface S3 and a fourth side surface S4. The third side surface S3 may be disposed between the first side surface S1 and the second side surface S2 to connect the two side surfaces S1 and S2. For example, one end of the third side surface S3 may be connected to one end of the first side surface S1 and the other end of the third side surface S3 may be connected to one end of the second side surface S2. Also, the fourth side surface S4 may be disposed to face the third side surface S3 in the first direction (x-axis direction). The fourth side surface S4 may be disposed between the first side surface S1 and the second side surface S2 to connect the two side surfaces S1 and S2. For example, one end of the fourth side surface S4 may be connected to the other end of the first side surface S1 and the other end of the fourth side surface S4 may be connected to the other end of the second side surface S2. The third side surface S3 and the fourth side surface S4 may be provided as a flat surface or a curved surface. Also, the third side surface S3 and the fourth side surface S4 may be spaced apart from each other at a set interval. For example, an interval in the first direction (x-axis direction) between the third side surface S3 and the fourth side surface S4 may be constant. That is, the third side surface S3 and the fourth side surface S4 may be parallel. Also, an interval in the first direction between the third side surface S3 and the fourth side surface S4 may be changed. For example, the distance in the first direction between the third side surface S3 and the fourth side surface S4 may gradually increase or decrease in the second direction, or may increase and decrease in a wave shape.

The resin layer 410 may include a plurality of regions in which the light source portion 200 is disposed. For example, the resin layer 410 may include a first region A1 in which the first light source 210 is disposed, and may include a second region A2 in which the second light source 220 is disposed.

The first region A1 and the second region A2 may be disposed to face each other in the second direction (y-axis direction), and may be spaced apart from each other. Also, the first region A1 and the second region A2 may have shapes corresponding to each other, and may have areas corresponding to each other. The resin layer 410 may include a groove 450 formed between the first region A1 and the second region A2. The groove 450 may be disposed between the first light source 210 and the second light source 220. That is, the first light source 210 may be disposed between the first side surface S1 and the groove 450, and the second light source 220 may be disposed between the second side surface S2 and the groove 450. The groove 450 may be filled with air or a vacuum.

The groove 450 may be provided in a form penetrating the upper and lower surfaces of the resin layer 410. Also, a through hole formed in a region corresponding to the groove 450 may be formed in the substrate 100. The through hole of the substrate 100 may have a shape and size corresponding to the groove 450. The groove 450 may have a shape extending in one direction. In detail, the groove 450 may extend in a direction corresponding to a direction in which the first light source 210 and the second light source 220 are disposed. For example, when the first light source 210 and the second light source 220 are disposed to extend in the first direction (x-axis direction), the groove 450 may have an extended form in the first direction (x-axis direction). In this case, the first direction length W3 of the groove 450 may be longer than the first direction length of the light source portion 200. The first direction length W3 of the groove 450 may be 50% or more of the first direction length W1 of the resin layer 410. For example, the first direction length W3 of the groove 450 may be longer than the first direction length d1 of the region in which the plurality of first light sources 210 are disposed. Here, the first direction length d1 of the region in which the plurality of first light sources 210 are disposed may be defined as the first direction length d1 from one end of the 1-1 light source 210a disposed first among the plurality of first light sources 210 to the other end of the last 1-nth light sources 210d. Here, the n is 4 or more.

A first direction length W3 of the groove 450 may be longer than a first direction length d2 of a region in which the plurality of second light sources 220 are disposed. Here, the first direction length d2 of the region in which the plurality of second light sources 220 may be defined as the first direction length d2 from one end of the 2-1 light source 220a disposed first among the plurality of second light sources 220 to the other end of the last 2-nth light source 220d. Here, the n is 4 or more. The groove 450 may have a length W4 in the second direction (y-axis direction). The lengths d1 and d2 in the first direction are lengths of both ends of the first and second light sources 210 and 220, respectively. The length W4 in the second direction of the groove 450 may be about 1 mm or more. In detail, the length W4 in the second direction of the groove 450 may be 1.5 mm or more. In more detail, the length W4 in the second direction of the groove 450 may be about 2 mm to about 5 mm. When the length W4 in the second direction of the groove 450 is less than about 1 mm, it may be difficult to block the light emitted from the first light source 210 or the second light source 220 from being transmitted to the second region A2 or the first region A1. In addition, when the length W4 in the second direction of the groove 450 exceeds about 5 mm, the area occupied by the groove 450 in the resin layer 410 is excessively increased, so that the light guiding distance of the light source portion 200 may be reduced.

The resin layer 410 may include a connection portion 470. The connection portion 470 may be disposed between the first region A1 and the second region A2. The connection portion 470 may connect the first region A1 and the second region A2 spaced apart from each other. The connection portion 470 may be a region between the first and second regions A1 and A2 of the resin layer 410 in which the groove 450 is not formed. The connection portion 470 may have lengths d3 and d4 in the first direction. For example, a first direction length d3 between one end of the groove 450 and the third side surface S3 and a first direction length d4 between the other end of the groove 450 and the fourth side surface S4 may be about 2 mm or more. The first direction lengths d3 and d4 of the connection portion 470 may be lengths in consideration of reliability of the resin layer 410 and the substrate 100. Also, the second direction length of the connection portion 470 may be the same as the second direction length W4 of the groove 450.

The resin layer 410 may include a groove 450 disposed between the plurality of first light sources 210 and the plurality of second light sources 220. In this case, the first direction length W3 of the groove 450 may be greater than a length d2 connecting both ends of the first light sources 210 and/or a length d2 connecting both ends of the second light sources 220. The second direction length W4 of the groove 450 may be smaller than the first direction length W3, and may be smaller than an interval between the first and second light sources 210 and 220. Accordingly, the groove 450 may be to prevent or minimize movement in which the light emitted from the first light source 210 moves to the second region A2 and the light emitted from the second light source 220 moves to the first region A1, respectively. Accordingly, the lighting device 1000 may provide light having a uniform intensity, and may provide a set stereoscopic image clearly. Since the resin layer 410 has a connection portion 470 having first and second lengths d3, d4, and W4 between the first region A1 and the second region A2, the resin layer 410 may prevent deterioration of optical reliability due to the groove 450.

As shown in FIGS. 3 and 4, the light blocking layer 500 may be disposed on the resin layer 410. The light blocking layer 500 may be disposed on the uppermost portion of the resin layer 410. The light blocking layer 500 may be disposed closest to the optical layer 700 among the layers included in the lighting module. The light blocking layer 500 may include a metal or non-metal material. The light blocking layer 500 may include an absorbing material or a reflective material. The light blocking layer 500 may absorb or reflect visible light, infrared light, or some ultraviolet light. For example, the light blocking layer 500 may absorb or reflect a wavelength in a range of 380 nm to 800 nm. For example, the light blocking layer 500 may be black ink or a black printed layer. The light blocking layer 500 may be an absorbing material having carbon or carbon nanotubes, a black resist material, or a black matrix material. As another example, the light blocking layer 500 may be a reflective layer, for example, may be formed of a layer having aluminum (Al) or silver (Ag), or an alloy layer having at least one of the above metals. The light blocking layer 500 may be a single layer or multiple layers. For example, in the case of multi-layers, the multi-layers may include a first layer of a black material and a second layer of a reflective material, and in this case, the first layer may be disposed on the second layer. The light blocking layer 500 may be implemented using a masking film.

The thickness h3 of the light blocking layer 500 may be about 0.1 mm to about 5 mm. When the thickness h3 of the light blocking layer 500 is less than about 0.1 mm, it is difficult for the light blocking layer 500 to effectively block the light passing through the resin layer 410 and light transmittance may be increased. In addition, when the thickness h3 of the light blocking layer 500 exceeds about 5 mm, light blocking characteristics may be improved, but the overall weight of the lighting module may increase. In addition, since the overall thickness of the lighting module is increased, it may be difficult to provide the lighting module in a flexible form, and thus it may be difficult to apply the lighting module to a housing, a bracket, etc. of a lamp having various curved shapes.

The light blocking layer 500 may include an opening portion 510. The opening portion 510 may be a hole passing through the upper and lower surfaces of the light blocking layer 500. The opening portion 510 may include a plurality of openings (n, n is a natural number equal to or greater than 3). The plurality of openings may have various shapes according to a stereoscopic image to be implemented. For example, the upper shape of the plurality of openings may be a polygonal shape such as a square, rectangular, triangular or pentagonal shape, a circular or elliptical shape, or an irregular shape. The plurality of openings may have the same or different shapes. In addition, the plurality of openings may have a partially identical shape or partially different shape. The number of the plurality of openings may be greater than or equal to the number of light sources included in the light source portion 200. For example, the total number of the plurality of openings may be greater than the total number of the first and second light sources 210 and 220.

Each of the plurality of openings may have a first direction (x-axis direction) length W5 and a second direction (y-axis direction) length W6. The first direction length W5 of the opening may be a factor capable of controlling the width (first direction length) of the formed stereoscopic image (linear light pattern). In addition, the second direction length W6 of the opening may be a factor that may control the luminance and length (second direction length) of the formed stereoscopic image (linear light pattern). For example, the lengths W5 and W6 in the first and second directions of each of the plurality of openings may be about 3 mm or more. In detail, the first and second direction lengths W5 and W6 of each of the plurality of openings may be about 3 mm to about 10 mm. When each of the first and second direction lengths W5 and W6 of the opening is less than about 3 mm, the size of the formed light pattern is too small, so that it may be difficult to visually recognize a stereoscopic image from the outside. In addition, when each of the first and second direction lengths W5 and W6 of the opening exceeds about 10 mm, the size of the formed light pattern is too large, so that the light pattern may not be stereoscopic image viewed from the outside. Accordingly, each of the first and second direction lengths W5 and W6 of the opening preferably satisfies the above-described range. In addition, the first and second direction lengths W5 and W6 of each of the plurality of openings may be the same or different from each other within the above-described range.

As shown in FIG. 1, the plurality of openings of the opening portion 510 may include a first opening 511 and a second opening 512. The first opening 511 may be provided in plurality, and may be arranged with regularity. In addition, the second opening 512 may be provided in plurality, and may be arranged with regularity.

For example, the plurality of first openings 511 may be spaced apart from each other and disposed in a region corresponding to the first region A1 of the resin layer 410.

The plurality of first openings 511 may be disposed on an emission path of the light emitted from the light source portion 200. For example, when viewed from the top view, the plurality of first openings 511 may be disposed between the first light source 210 and the first side surface S1 of the resin layer 410. In this case, the plurality of first openings 511 may not overlap the first light source 210 in the vertical direction (z-axis direction). Accordingly, it is possible to prevent a hot spot from being formed by the first light source 210 on the first opening 511. Alternatively, the first opening 511 may partially overlap the light source portion 200 in a vertical direction. Accordingly, the lighting device 1000 may provide a stereoscopic image having various luminous intensity by intentionally forming a hot spot. The plurality of first openings 511 may have a set shape and size. For example, the plurality of first openings 511 may have the same shape and may have the same first and second direction lengths W5 and W6. Also, the number of the plurality of first openings 511 may be greater than the number of the plurality of first light sources 210. The shape, size, number, etc. of the plurality of first openings 511 may be changed according to a stereoscopic image to be implemented.

The plurality of second openings 512 may be spaced apart from each other and disposed in a region corresponding to the second region A2 of the resin layer 410. The plurality of second openings 512 may be disposed on an emission path of the light emitted from the light source portion 200. For example, when viewed from the top view, the plurality of second openings 512 may be disposed between the second light source 220 and the second side surface S2 of the resin layer 410. In this case, the plurality of second openings 512 may not overlap the second light source 220 in the vertical direction (z-axis direction). Accordingly, it is possible to prevent a hot spot from being formed on the second opening 512 by the second light source 220. Alternatively, the second opening 512 may partially overlap the light source portion 200 in the vertical direction. Accordingly, the lighting device 1000 may provide a stereoscopic image having various luminous intensity by intentionally forming a hot spot.

The plurality of second openings 512 may be spaced apart from the plurality of first openings 511. For example, the second opening 512 may be spaced apart from the first opening 511 in a second direction (y-axis direction). The plurality of second openings 512 may have a set shape and size. For example, the plurality of second openings 512 may have the same shape and may have the same first and second direction lengths W5 and W6. The plurality of second openings 512 may have the same shape and lengths W5 and W6 in first and second directions as the plurality of first openings 511. Also, the number of the plurality of second openings 512 may be greater than the number of the plurality of second light sources 220. The number of the plurality of second openings 512 may be different from or equal to the number of the plurality of first light sources 210. The shape, size, number, etc. of the plurality of second openings 512 may be changed according to a stereoscopic image to be implemented.

The light emitted from the light source portion 200, for example, the light emitted from the plurality of first light sources 210 may be transmitted to the optical layer 700 through the plurality of first openings 511, and the light emitted from the plurality of second light sources 220 may be transmitted to the optical layer 700 through the plurality of second openings 512. Then, the light transmitted to the optical layer 700 may pass through the optical layer 700 and be emitted to the outside of the lighting device 1000, and may be viewed as a linear stereoscopic image. The shape, size, location, etc. of the opening portion 510 will be described in more detail with reference to FIGS. 12 to 20 to be described later.

The optical layer 700 may be disposed on the lighting module. The optical layer 700 may be disposed on the light blocking layer 500. The optical layer 700 may form a stereoscopic image by reflecting and/or refracting the light incident from the lighting module. The optical layer 700 may have the same planar area as the upper surface of the lighting module or may have a larger planar area than the upper surface of the lighting module. The optical layer 700 may be spaced apart from the light blocking layer 500 by an interval h4 in a vertical direction (z-axis direction). The interval h4 between the optical layer 700 and the light blocking layer 500 may be constant. Accordingly, the first air layer 800 may be formed between the optical layer 700 and the light blocking layer 500. The interval h4 may be a distance through which light emitted through the opening portion 510 of the light blocking layer 500 may be diffused. Also, the interval h4 may be a distance that may adjust the size of a stereoscopic image formed through the optical layer 700. The interval h4 may be about 5 mm or more. In detail, the interval h4 may be about 5 mm to about 50 mm. In more detail, the interval h4 may be about 5 mm to about 20 mm. When the interval h4 is less than about 5 mm, the size of the stereoscopic image formed through the optical layer 700 is small, so it may be difficult to see the three-dimensional effect due to the difference in luminance. In addition, when the interval h4 exceeds about 50 mm, the size of the stereoscopic image formed through the optical layer 700 may increase, and thus the three-dimensional effect may be deteriorated. Accordingly, the interval h4 between the optical layer 700 and the light blocking layer 500 preferably satisfies the above-described range.

The optical layer 700 may include a transmissive portion 710 and a plurality of optical patterns 720. The transmissive portion 710 may be a support member supporting the plurality of optical patterns 720. The transmissive portion 710 may be provided in the form of a plate or a film, and may emit incident light from the inside in an exit direction. The transmissive portion 710 may include a transmissive material. For example, a material of the transmissive portion 710 may be resin or glass, and the resin may include a thermoplastic polymer or a photocurable polymer. In addition, the material of the transmissive portion 710 may include polymethylmethacrylate, polycarbonate or polystyrene, and polyethylene terephthalate. In addition, the material of the transmissive portion 710 may be made of an ultraviolet curing resin containing an oligomer, and more specifically, a resin containing a urethane acrylate oligomer as a main raw material. That is, it may be used a resin in which a urethane acrylate oligomer, which is a synthetic oligomer, and a polymer type, which is a polyacrylic, are mixed.

The transmissive portion 710 may have a set thickness h52. For example, the thickness h52 of the transmission portion 710 may be about 0.1 mm or more. In detail, the thickness h52 of the transmissive portion 710 may be about 0.1 mm to about 10 mm. Preferably, the thickness h52 of the transmissive portion 710 may satisfy about 0.1 mm to about 0.25 mm in consideration of the three-dimensional effect realization and an entire thickness of the lighting device 1000.

The plurality of optical patterns 720 may be disposed on one surface of the transmissive portion 710. In detail, the plurality of optical patterns 720 may be disposed on at least one of a lower surface of the transmissive portion 710 facing the light blocking layer 500 and an upper surface opposite to the lower surface of the transmissive portion 710. The plurality of optical patterns 720 may include a lenticular lens shape or a micro lens shape with a semi-cylindrical shape. The plurality of optical patterns 720 may be integrally formed with the transmissive portion 710. Alternatively, the plurality of optical patterns 720 may be adhered to the upper surface or lower surface of the transmissive portion 710 by an adhesive member or the like. The optical pattern 720 may include a light-transmitting material. For example, the optical pattern 720 may be formed of a thermoplastic polymer or a photocurable polymer, or may be formed of the same material as the transmissive portion 710. The optical pattern 720 may be formed on the upper surface or the lower surface of the transmissive portion 710 through a photomask process. The optical pattern 720 may have no difference in refractive index from the transmissive portion 710 or may have a refractive index difference of 0.2 or less, thereby minimizing light loss due to the refractive index difference. The optical pattern 720 may have a shape capable of refracting incident light. The optical pattern 720 may have a long axis in the direction of the light emitting surfaces 215 and 225 of the light source portion 200. In detail, the optical pattern 720 may have a shape extending with a long axis in a direction perpendicular to the light emission direction of the light source portion 200. For example, the plurality of optical patterns 720 may be arranged in the second direction (y-axis direction) on the upper surface of the transmissive portion 710 as shown in the drawing, and may have a long axis in the first direction (x-axis direction). In detail, the optical pattern 720 may be arranged in a second direction according to the stereoscopic image of the lighting device 1000 and may have a long axis in the first direction.

The plurality of optical patterns 720 may have a stripe or bar shape, a sinusoidal shape, or a sawtooth shape having a long axis in the first direction. The plurality of optical patterns 720 may be arranged as a combination of lens portion or unit patterns disposed on one surface or the other surface of the transmissive portion 710. In addition, the optical pattern 720 may have at least one of a hemispherical shape, a semi-ellipse shape, and a polygonal shape in a lateral cross-sectional shape in the second direction. The optical pattern 720 may be provided in a set size. For example, the length W7 in the second direction (y-axis direction) of the optical pattern 720 may be about 5 µm or more. In detail, the second direction length W7 of the optical pattern 720 may be about 5 µm to about 100 µm. In more detail, the second direction length W7 of the optical pattern 720 may be about 10 µm to about 80 µm. The length W7 in the second direction of the optical pattern 720 preferably satisfies the above-described range in consideration of the sharpness characteristic of the formed stereoscopic image.

A height (z-axis direction) h51 of the optical pattern 720 may be smaller than a second direction (y-axis direction) length W7 of the optical pattern 720. The height h51 of the optical pattern 720 may be less than or equal to about 0.5 times the length W7 of the optical pattern 720 in the second direction. In detail, the height h51 of the optical pattern 720 may be about 0.1 to 0.48 times the second direction length W7 of the optical pattern 720. When the height h51 of the above-described optical pattern 720 is greater than the above-described range, the size of the optical pattern 720 may increase and the stereoscopic effect may be insignificant. In addition, when the height h51 of the optical pattern 720 is smaller than the above-described range, the sharpness characteristic of the stereoscopic image may be deteriorated. An interval P1 between the plurality of optical patterns 720 may be about 11 µm to about 100 µm. In detail, the interval P1 between the plurality of optical patterns 720 may be about 11 µm to about 10 µm. The interval P1 between the plurality of optical patterns 720 preferably satisfies the above-described range in consideration of the sharpness characteristic of the stereoscopic image.

Accordingly, the optical layer 700 may provide a stereoscopic image. In detail, the light emitted from the light source portion 200 may be emitted in the form of a point light source having a uniform intensity through the opening portion 510 to be incident on the optical layer 700. Thereafter, the light incident on the optical layer 700 may be reflected and/or refracted by the optical pattern 720 to pass through the optical layer 700, and may be provided as a light pattern having a linear shape. The pattern of light passing through the optical layer 700 may form a stereoscopic image in a direction orthogonal to the long axis of the optical pattern 720. In addition, the linear shape of the light pattern may include a curved line having a curvature, and may be less than or equal to the total number of the first and second openings 511 and 512 included in the opening portion 510. A width of the light pattern having a linear shape may vary according to widths of the first and second openings 511 and 512. For example, as the widths of the first and second openings 511 and 512 increase, the width of the light pattern may increase, and as the widths of the first and second openings 511 and 512 decrease, the width of the light pattern may increase.

The light emitted from the optical layer 700 may have the highest luminous intensity in the central region Img1 corresponding to the opening portion 510 in a vertical direction. In addition, the side regions Img2 and Img3 disposed adjacent to the central region Img1 may have a lower luminous intensity than the luminous intensity of the central region Img1. The lighting device 1000 may form a stereoscopic image by the difference in luminance. The optical layer 700 may control the position, size, shape of the stereoscopic image formed according to the interval h4 between the optical layer 700 and the light blocking layer 500. For example, the stereoscopic image may be formed in a region Img_a adjacent to the light blocking layer 500 or a distant region Img_b according to the interval h4 between the optical layer 700 and the light blocking layer 500. Accordingly, the lighting device 1000 according to the embodiment may provide various stereoscopic images by controlling the interval h4 between the light blocking layer 500 and the optical layer 700, the size and shape of the optical pattern 720, and the positions and the shape of the plurality of opening portions.

Figure 6:
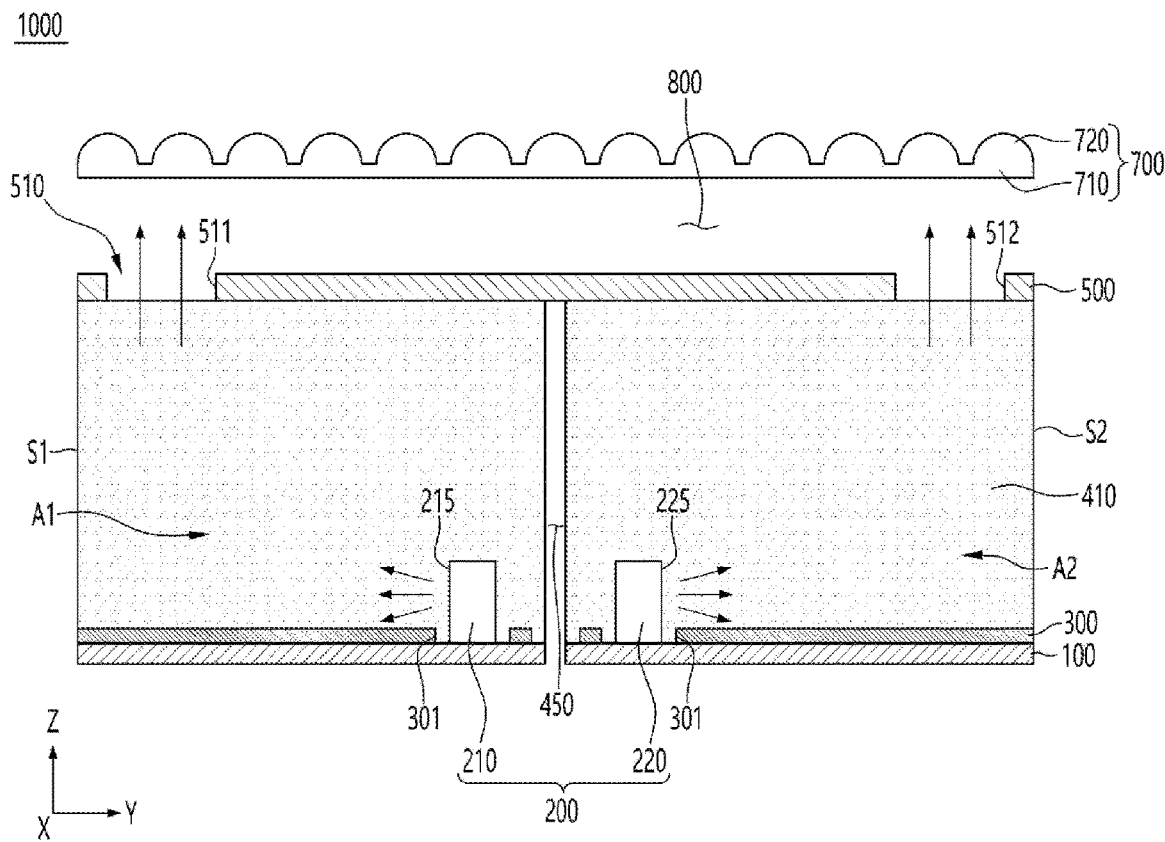
FIGS. 6 to 11 are other cross-sectional views of a lighting device according to an embodiment.
Figure 7:
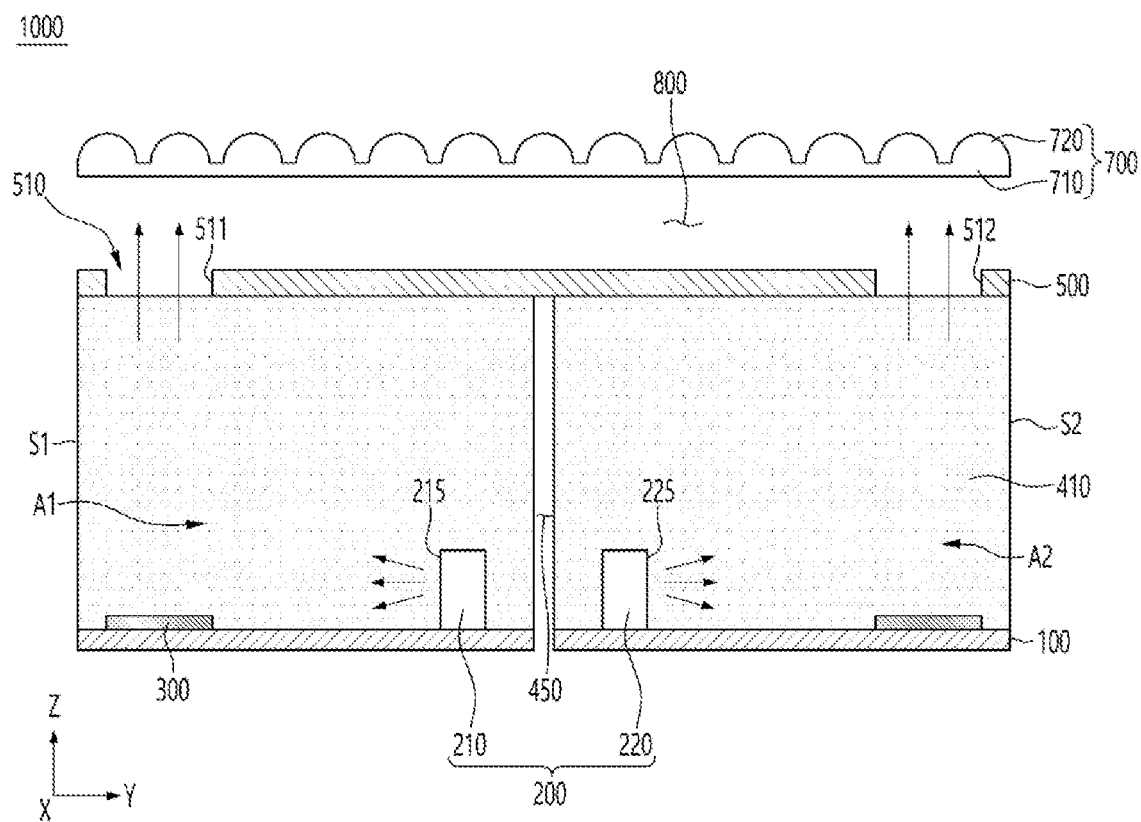

FIGS. 6 and 7 are other cross-sectional views of a lighting device according to an embodiment. In the description using FIGS. 6 and 7, descriptions of the same and similar components as those of the above-described lighting device are omitted, and the same reference numerals are assigned to the same and similar components.

Referring to FIG. 6, the lighting device 1000 may include a reflective layer 300. The reflective layer 300 may be disposed between the substrate 100 and the resin layer 410. The reflective layer 300 may have an area smaller than an area of the upper surface of the substrate 100. The reflective layer 300 may be disposed on most of the upper surface of the substrate 100. For example, in a vertical direction, the reflective layer 300 may be disposed in a region corresponding to the opening portion 510, or may be disposed in a region not corresponding to the opening portion 510. In addition, the reflective layer 300 may be spaced apart from the edge of the substrate 100, and the resin layer 410 may be attached to the substrate 100 in the spaced region. Accordingly, it is possible to prevent the edge portion of the reflective layer 300 from peeling off.

The reflective layer 300 may include an opening portion 301 in which a lower portion of the light source portion 200 is disposed. In the opening portion 301 of the reflective layer 300, the upper surface of the substrate 100 is exposed and a portion to which the lower portion of the light source portion 200 is bonded may be disposed. The size of the opening portion 301 may be the same as or larger than the size of the first light source 210 and the second light source 220 included in the light source portion 200, but is not limited thereto. The reflective layer 300 may be smaller than the thickness of the substrate 100. For example, the reflective layer 300 may be provided to have a thickness of about 0.5 to about 1 time the thickness of the substrate 100 to reduce transmission loss of incident light. Also, the reflective layer 300 may be formed to have a thickness smaller than that of the light source portion 200. The reflective layer 300 may have a thickness of about 0.2 mm to about 0.4 mm. Through the opening portion 301 of the reflective layer 300, a lower portion of the light source portion 200 may be inserted into the reflective layer 300, and an upper portion of the light source portion 200 may protrude. Each of the light emitting surfaces 215 and 225 of the first light source 210 and the second light source 220 may be provided in a direction perpendicular to the upper surface of the reflective layer 300.

The reflective layer 300 may include a metallic material or a non-metallic material. The metallic material may include a metal such as aluminum, silver, or gold. The non-metallic material may include a plastic material or a resin material. The plastic material may be any one selected from the group consisting of polyethylene, polypropylene, polystyrene, polyvinyl chloride, polybiphenyl chloride, polyethylene terephthalate, polyvinyl alcohol, polycarbonate, polybutylene terephthalate, polyethylene naphthalate, polyamide, polyacetal, polyphenylene, polyamideimide, polyetherimide, polyetheretherketone, polyimide, polytetrafluoroethylene, liquid crystal polymer, fluororesin, copolymers thereof, and mixtures thereof. As the resin material, a reflective material, for example, a metal oxide such as $TiO_2$, $Al_2O_3$, or $SiO_2$ may be added in silicon or epoxy. The reflective layer 300 may be implemented as a single layer or a multilayer, and light reflection efficiency may be improved by such a layer structure. The reflective layer 300 according to the embodiment reflects the incident light, thereby increasing the amount of light so that the light is emitted with a uniform distribution. Here, the reflective layer 300 may be omitted when a highly reflective material is coated on the upper surface of the substrate 100. The reflective layer 300 may include a plurality of reflectors (not shown). The reflector may be a bubble, such as air, or a medium having the same refractive index as that of air. The reflective layer 300 may reflect the light incident by the plurality of reflectors or refract it in a different direction.

The reflective layer 300 may include a reflective pattern (not shown). The reflective pattern may have a shape of a plurality of dots. The plurality of reflective patterns may be disposed on the upper surface of the reflective layer 300. For example, the plurality of reflective patterns may be disposed to protrude from the upper surface of the reflective layer 300. The plurality of reflective patterns may be spaced apart from the light source portion 200 and disposed in an emission direction of the light emitted from the light source portion 200. The plurality of reflective patterns may be formed on the reflective layer 300 by printing. The plurality of reflective patterns may include reflective ink. The plurality of reflective patterns may be printed on a material including any one of $TiO_2$, $CaCO_3$, $BaSO_4$, $Al_2O_3$, Silicon, and PS. A planar shape of each of the plurality of reflective patterns may be one selected from a circle, an ellipse, and a polygon. In addition, each of the plurality of reflective patterns may have a side cross-section having a hemispherical shape or a polygonal shape. The material of the plurality of reflective patterns may be white. The dot pattern density of the plurality of reflective patterns may increase as the distance from the light source portion 200 increases. In detail, the density of the reflective pattern per unit area may increase as the distance from each of the light emitting surfaces 215 and 225 of the first light source 210 and the second light source 220 increases. For example, the density of the reflective pattern per unit area may increase from the light emitting surface 215 of the first light source 210 toward the first side surface S1 and may increase from the light emitting surface 225 of the second light source 225 toward the second side source S2. The size of the plurality of reflective patterns may change as the distance from each of the light emitting surfaces 215 and 225 of the first and second light sources 210 and 220 increases. In detail, the horizontal width of the plurality of reflective patterns may increase as the distance from the light emitting surfaces 215 and 225 of the light source portion 200 increases. For example, the size of the reflective pattern increases from the light emitting surface 215 of the first light source 210 toward the first side source S1 in the direction of the light emitting surface 225 of the second light source 220. It may increase in the direction of the second side surface S2. The plurality of reflective patterns may be further disposed between the light source portion 200 and the groove 450 of the resin layer 410. In detail, the reflective pattern may be further disposed between the first light source 210 and the groove 450 and between the second light source 220 and the groove 450. Accordingly, the lighting device 1000 may minimize light loss by re-reflecting the light provided between the light source portion 200 and the groove 450 by reflection. That is, since the plurality of reflective patterns is disposed on a travel path of light emitted from the light source portion 200 and/or a travel path of light emitted from the light source portion 200 and reflected in other components, the light reflectance may be improved, the light loss may be reduced, and the luminance of the point light emitted through the opening portion 510 may be improved.

Referring to FIG. 7, the reflective layer 300 may be disposed on a partial region of the substrate 100. For example, the reflective layer 300 may be disposed on an emission path of the light source portion 200. In detail, the reflective layer 300 may be disposed between the first side surface S1 and the light emitting surface 215 of the first light source 210, and between the second side surface S2 and the light emitting surface 225 of the second light source 220. In addition, the reflective layer 300 may be disposed in a region corresponding to the opening portion 510 in the vertical direction. In this case, the reflective layer 300 may be provided with a predetermined horizontal width. For example, the horizontal width of the reflective layer 300 may be about 1 to about 1.5 times the first and second lengths W5 and W6 of the opening portion 510. Accordingly, the reflective layer 300 is disposed in a minimum area on the travel path of the light emitted from the light source portion 200 to improve light reflectance and prevent light loss. Accordingly, the luminance of the point light source emitted through the opening portion 510 may be improved, and a hot spot by the light source portion 200 may be prevented from being formed on the opening portion 510.

Figure 8:
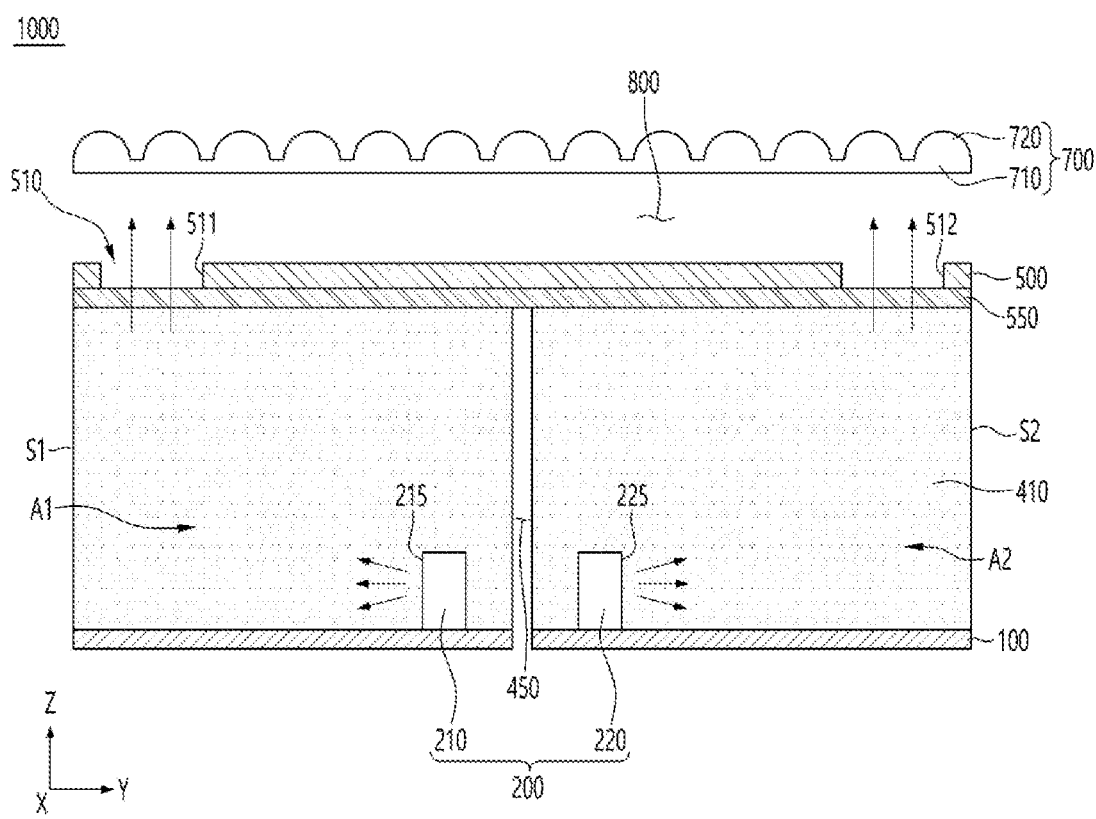
Figure 9:
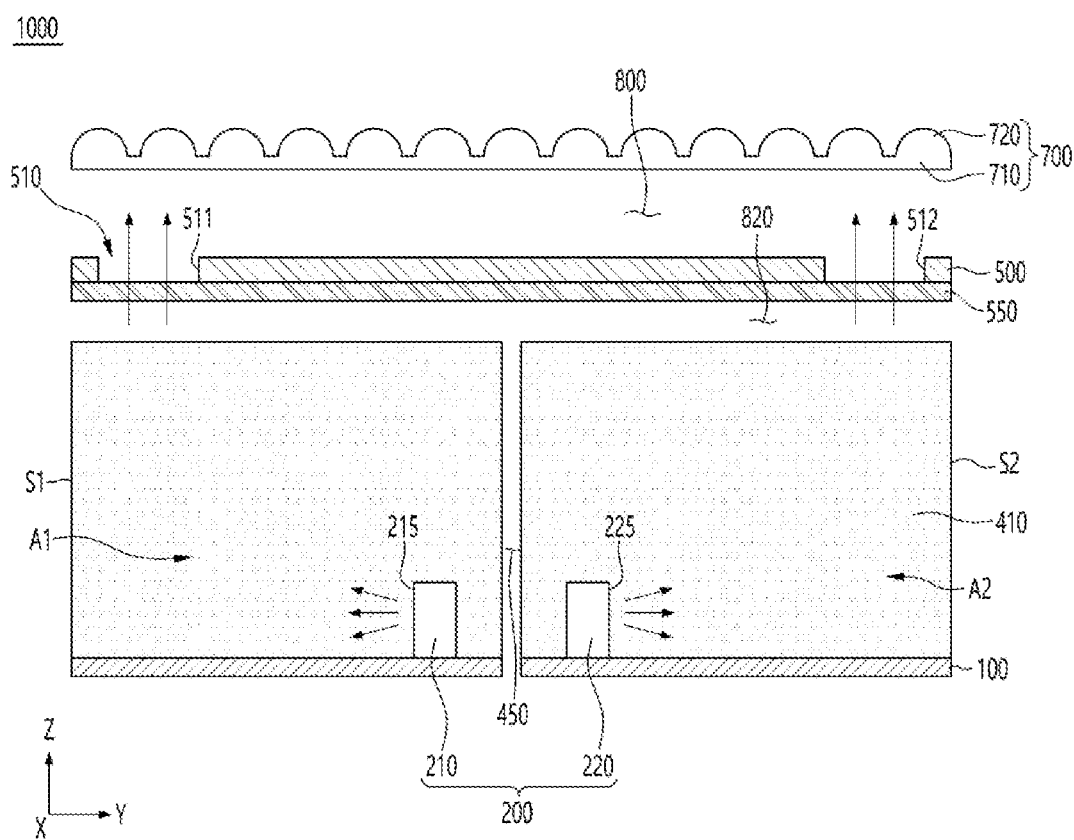

FIGS. 8 and 9 are other cross-sectional views of a lighting device according to an embodiment. In the description using FIGS. 8 and 9, descriptions of the same and similar components as those of the above-described lighting device are omitted, and the same reference numerals are assigned to the same and similar components.

Referring to FIG. 8, the lighting device 1000 according to the embodiment may further include a light transmitting layer 550. The light transmitting layer 550 may be disposed between the resin layer 410 and the light blocking layer 500. The light transmitting layer 550 may be disposed in contact with the upper surface of the resin layer 410. In addition, the light transmitting layer 550 may be disposed in contact with the lower surface of the light blocking layer 500. The light transmitting layer 550 is provided as a wavelength conversion layer and may include a wavelength conversion material. For example, the light transmitting layer 550 may include a wavelength conversion material of at least one of a phosphor and a quantum dot. For example, the light transmitting layer 550 may include a phosphor and may emit light such as white, blue, yellow, green, or red. The phosphor may include at least one or two types of a green phosphor, a red phosphor, an amber phosphor, a yellow phosphor, a white phosphor, and a blue phosphor. The phosphor may include at least one of YAG-based, TAG-based, silicate-based, sulfide-based, and nitride-based phosphors.

The light transmitting layer 550 may absorb a portion of the first light emitted from the light source portion 200 and convert it into second light having a wavelength band different from that of the first light. In detail, the light transmitting layer 550 may absorb a portion of the first light emitted from the light source portion 200 and emitted through the upper surface of the resin layer 410 to be converted into the second light.

The light transmitting layer 550 may have a set thickness. In detail, the light transmitting layer 550 may have a thickness smaller than that of the resin layer 410. For example, the thickness of the light transmitting layer 550 may be about 50 μm to about 500 μm. In detail, the thickness of the light transmitting layer 550 may be about 80 μm to about 400 μm. In more detail, the thickness of the light transmitting layer 550 may be about 100 μm to about 300 μm. When the thickness of the light transmitting layer 550 is less than about 50 μm, it may be difficult to convert the first light emitted from the light source portion 200 into the second light. In addition, when the thickness of the light transmitting layer 550 is less than about 50 μm, the color of the light transmitting layer 550 may not be clearly recognized when the lighting device 1000 is turned off, and an internal configuration of the lighting device 1000 may be visually recognized from the outside. In addition, when the thickness of the light transmitting layer 550 exceeds about 500 μm, the first light emitted from the light source portion 200 may be effectively converted into the second light, but the thickness of the light transmitting layer 550 may be relatively thick. Accordingly, the overall thickness of the lighting device 1000 may increase, so that flexibility may be reduced, and the light emitted from the light source portion 200 may be lost in the process of passing through the light transmitting layer 550 to decrease overall luminance. Accordingly, the luminance and sharpness of a stereoscopic image formed through the optical layer 700 may be reduced. Alternatively, the light transmitting layer 550 may perform a function of a blind sheet. In detail, the light transmitting layer 550 may prevent the light emitted from the light source portion 200 from being concentrated, for example, may perform a hot spot prevention function.

In this case, the light transmitting layer 550 may include a light-transmitting material. For example, the light transmitting layer 550 may include at least one of polyethylene terephthalate (PET), polystyrene (PS), polyimide (PI), polyethylene naphthalate (PEN), and poly carbonate (PC). A region of the light transmitting layer 550 other than where a transmission control pattern (not shown), which will be described later, is formed may be a light transmitting layer.

The light transmitting layer 550 may have a set thickness. For example, the thickness of the light transmitting layer 550 may be about 50 μm to about 300 μm. In detail, the thickness of the light transmitting layer 550 may be about 80 μm to about 250 μm. In more detail, the thickness of the light transmitting layer 550 may be about 100 μm to about 200 μm. When the thickness of the light transmitting layer 550 is less than about 50 μm, it may be difficult for the light transmitting layer 550 to effectively block light incident from the bottom. That is, since the light transmitting layer 550 does not have a sufficient thickness for hot spot control, a hot spot may be formed. In addition, when the thickness of the light transmitting layer 550 exceeds about 300 μm, it is possible to effectively control the formation of a hot spot by the light emitted from the light source portion 200, but when the light emitted from the light source portion 200 passes through the light transmitting layer 550, it is lost, and thus the overall luminance may be reduced. Accordingly, the thickness of the light transmitting layer 550 preferably satisfies the above-described range.

The light transmitting layer 550 may include a plurality of transmission control patterns (not shown) disposed to be spaced apart from each other in the first direction and the second direction. The plurality of transmission control patterns may be formed on at least one of an upper surface and a lower surface of the light transmitting layer 550. The transmission control pattern may block all or part of the light emitted through the resin layer 410. The transmission control pattern may include ink. For example, the transmission control pattern may be printed with a material including any one of $TiO_2$, $CaCO_3$, $BaSO_4$, $Al_2O_3$, Silicon, and PS. The transmission control pattern may be white having excellent reflection characteristics. In addition, the transmission control pattern may be provided in the form of a concave groove on the upper or lower surface of the optical layer 700. For example, when the transmission control pattern is formed on the upper surface of the light blocking layer 500, the transmission control pattern may be provided in the form of a concave groove in a direction from the top surface to the bottom surface of the optical layer 700. The plurality of transmission control patterns may be disposed in a region corresponding to the opening portion 510. The plurality of transmission control patterns may be formed to have a set thickness, and the transmittance of the light may be controlled by blocking or partially transmitting light incident on the transmission control pattern.

The lighting device 1000 according to the embodiment may include a light transmitting layer 550 that performs at least one of wavelength conversion and a blind function. Accordingly, the lighting device 1000 may change the light emitted from the light source portion 200 to a set color, and may improve the luminance uniformity characteristic of the light emitted through the opening portion 510.

Referring to FIG. 9, the light transmitting layer 550 may be disposed between the resin layer 410 and the light blocking layer 500. In this case, the light transmitting layer 550 may directly contact the light blocking layer 500. In addition, the light transmitting layer 550 may be spaced apart from the resin layer 410 in a vertical direction (z-axis direction). Accordingly, a second air layer 820 may be formed between the resin layer 410 and the light transmitting layer 550. The lighting device 1000 according to the embodiment may more effectively control a hot spot of light by disposing the second air layer 820 between the resin layer 410 and the light transmitting layer 550. In addition, the refraction angle and travel path of light may be controlled by the second air layer 820, so that a stereoscopic image may be formed more effectively.

Figure 10:
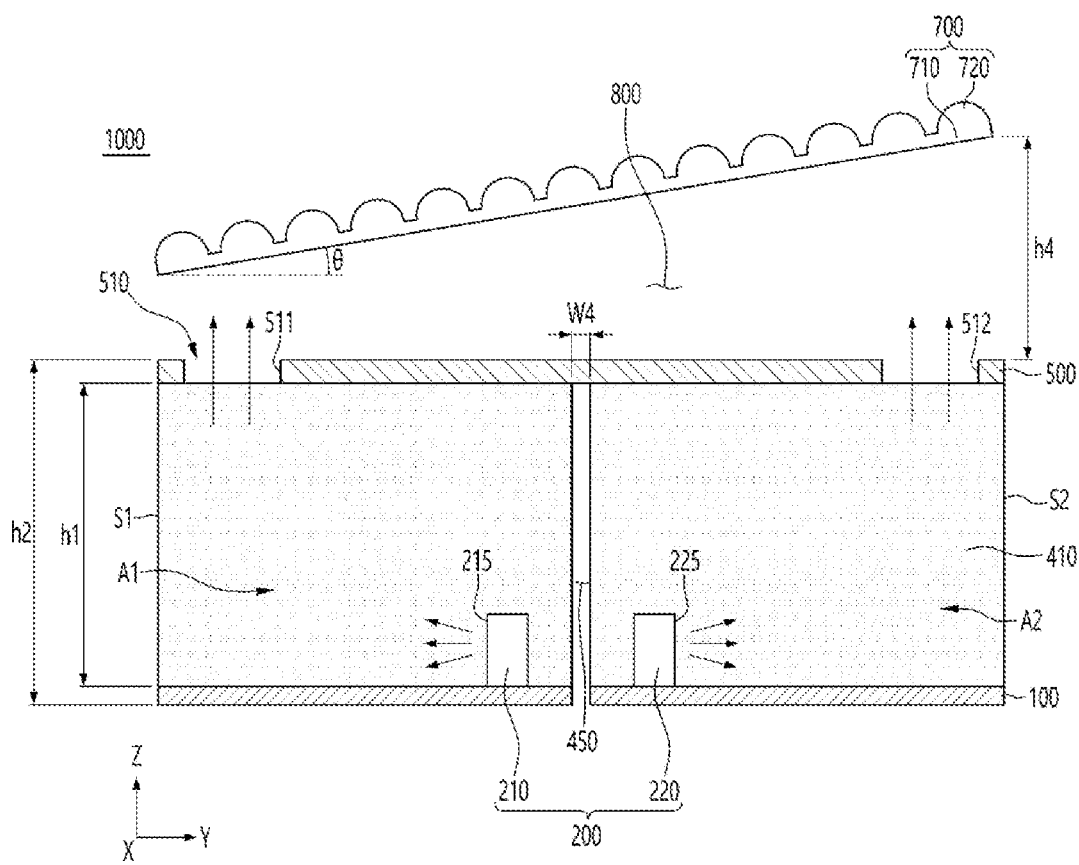

FIG. 10 is another cross-sectional view of a lighting device according to an embodiment. In the description using FIG. 10, descriptions of the same and similar components as those of the above-described lighting device are omitted, and the same reference numerals are assigned to the same and similar components.

Referring to FIG. 10, the optical layer 700 may be disposed on the lighting module. The optical layer 700 may be disposed on the light blocking layer 500. The optical layer 700 may form a stereoscopic image by reflecting and/or refracting the light incident from the lighting module. The optical layer 700 may be spaced apart from the light blocking layer 500 by a predetermined interval h4 in a vertical direction (z-axis direction). The interval h4 may be a distance through which light emitted through the opening portion 510 of the light blocking layer 500 may be diffused. Also, the interval h4 may be a distance that may adjust the size of a stereoscopic image formed through the optical layer 700.

In the lighting device 1000 according to the embodiment, the interval h4 between the optical layer 700 and the light blocking layer 500 may vary. For example, the optical layer 700 may be disposed to be inclined at a predetermined inclination angle θ with respect to the upper surface of the resin layer 410. In this case, the inclination angle θ may be an acute angle of less than 90 degrees. Accordingly, the interval h4 between the optical layer 700 and the light blocking layer 500 may gradually increase or decrease in the horizontal direction, and the first air layer 800 disposed between the two components 500 and 700 may have a vertical height change according to the inclination angle of the optical layer 700. Accordingly, the lighting device 1000 according to the embodiment may implement various three-dimensional effects as the interval h4 changes.

Figure 11:
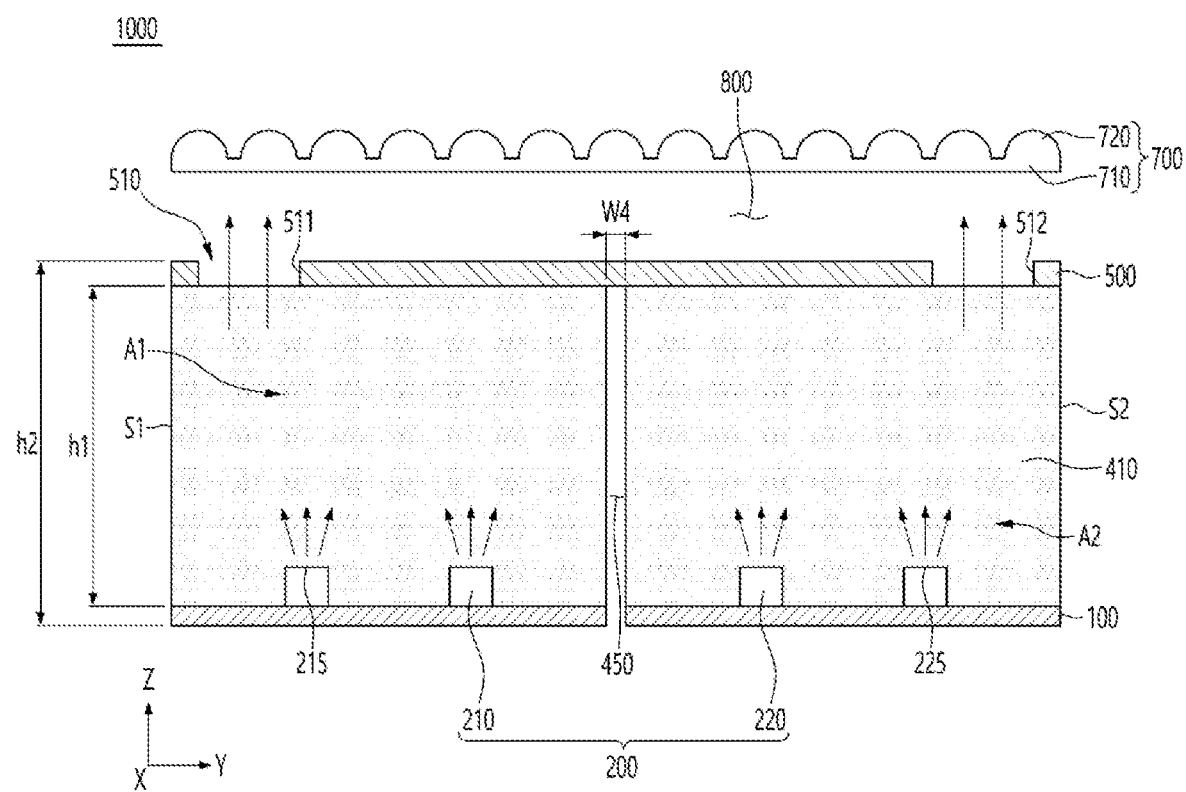

Referring to FIG. 11 is another cross-sectional view of a lighting device according to an embodiment. In the description using FIG. 11, descriptions of the same and similar components as those of the above-described lighting device are omitted, and the same reference numerals are assigned to the same and similar components.

Referring to FIG. 11, the light source portion 200 according to the embodiment may be disposed on the substrate 100. The light source portion 200 may be disposed on the upper surface of the substrate 100 facing the light blocking layer 500. The light source portion 200 is a device having an LED, and may include a package in which a light emitting chip is packaged. The light emitting chip may emit at least one of visible light such as blue, red, green, and yellow, ultraviolet (UV), and infrared light, and the light source portion 200 may emit at least one of ultraviolet rays of visible light such as white, blue, red, yellow, and green light, or infrared rays. The light source portion 200 may be a top view type in which the light emitting surfaces 215 and 225 face upward. That is, the optical axis OA of the light source portion 200 may be perpendicular to the upper surface of the substrate 100.

The light source portion 200 is an LED chip emitting light on five sides and may be disposed on the substrate 100 in the form of a flip chip. The light source portion 200 may emit at least one of visible light such as blue, red, green, and yellow, ultraviolet (UV) light, and infrared light. The light source portion 200 may include a plurality of light emitting surfaces, and the strongest light may be emitted toward upper surfaces 215 and 225 facing the light blocking layer 500. The light source portion 200 may be a horizontal chip or a vertical chip. In the horizontal chip, two different electrodes may be disposed in a horizontal direction, and in the vertical chip, two different electrodes may be disposed in a vertical direction. Since the light source portion 200 is connected to another chip or wiring pattern with a wire in the case of the horizontal chip or the vertical chip, the thickness of the module may increase due to the height of the wire, and a pad space for bonding the wire may be required.

The light source portion 200 may include a plurality of light sources. For example, the light source portion 200 may include a plurality of first light sources 210 disposed in the first region A1 of the resin layer 410 and a plurality of second light sources 220 disposed in the second region A2 of the resin layer 410. The plurality of first light sources 210 may be disposed to be spaced apart from each other in the first and/or second directions in the first region A1, and the plurality of second light sources 220 may be disposed to be spaced apart from each other in the first and/or second direction in the second region A2.

The light source portion 200 may emit light toward the upper surface of the resin layer 410. For example, the plurality of first light sources 210 may emit light toward the upper surface of the first region A1 of the resin layer 410, and the plurality of second light sources 220 may emit light toward the upper surface of the second region A2 of the resin layer 410. Thereafter, the light emitted from the plurality of first light sources 210 may be guided by the resin layer 410 and emitted through the first opening 511, and the light emitted from the plurality of second light sources 220 may be guided by the resin layer 410 and emitted through the second opening 512. In addition, although not shown in the drawings, a reflective layer 300 (See FIG. 6) may be further disposed between the substrate 100 and the resin layer 410. The reflective layer 300 may be disposed on most of the upper surface of the substrate 100. The reflective layer 300 may include an opening portion in which a lower portion of the light source portion 200 is disposed. In the opening portion of the reflective layer, the upper surface of the substrate 100 may be exposed and a portion to which the lower portion of the light source portion 200 is bonded may be disposed. The size of the opening portion in the reflective layer 300 may be the same as or larger than the size of the first light source 210 and the second light source 220 included in the light source portion 200, but is not limited thereto.

Accordingly, the light emitted from the light source portion 200 may be emitted in the form of a point light source having a uniform intensity through the opening portion 510. In addition, the light may be incident on the optical layer 700 to form a light pattern having a linear shape, for example, a stereoscopic image.

FIGS. 12 to 16 are views for explaining various opening portions of the light blocking layer in the lighting device according to the embodiment.

Figure 12:
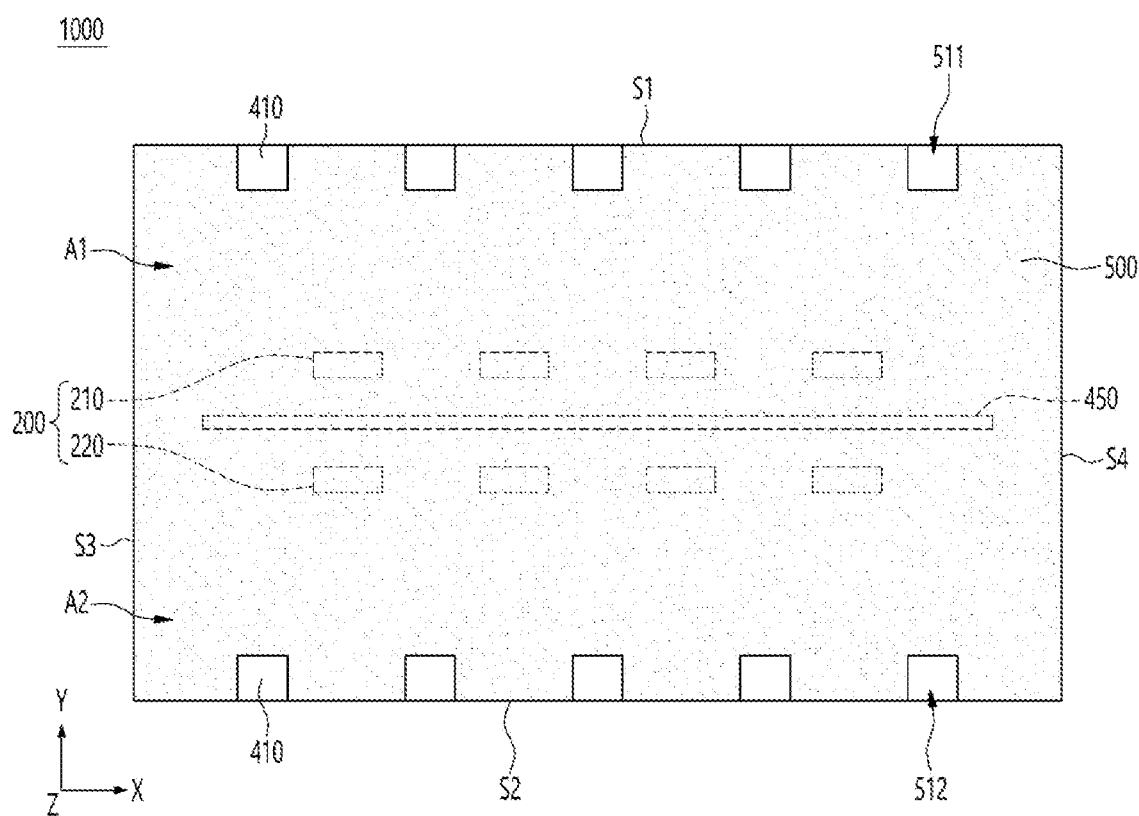
FIGS. 12 to 16 are views for explaining various openings of the light blocking layer in the lighting device according to the embodiment.

Referring to FIG. 12, the light blocking layer 500 according to the embodiment may include opening portion 510 penetrating the upper and lower surfaces of the light blocking layer 500. The opening portion 510 may include a plurality of openings (n, n is a natural number equal to or greater than 3). The opening portion 510 may include a first opening 511 and a second opening 512. The first opening 511 may be disposed in a region corresponding to the first region A1 of the resin layer 410. A plurality of the first openings 511 may be provided in the first region A1. The plurality of first openings 511 may be arranged with regularity. For example, the plurality of first openings 511 may be disposed to be spaced apart from each other in a first direction (x-axis direction). The plurality of first openings 511 may be spaced apart from each other at equal intervals. Also, the plurality of first openings 511 may have the same shape and have the same lengths in first and second directions (x-axis and y-axis directions). That is, the plurality of first openings 511 may have the same shape and regularity having the same lengths in the first and second directions.

The plurality of first openings 511 may be disposed in a region between the first side surface S1 and the first light source 210. The plurality of first openings 511 may be disposed in a region corresponding to the first side surface S1. The plurality of first openings 511 may be disposed in a region that does not vertically overlap with the first light source 210. The number of the plurality of first openings 511 may be greater than the number of the plurality of first light sources 210.

The second opening 512 may be disposed in a region corresponding to the second region A2 of the resin layer 410. The plurality of the second openings 512 may be provided in the second region A2. The plurality of second openings 512 may be arranged with regularity. For example, the plurality of second openings 512 may be disposed to be spaced apart from each other in the first direction (x-axis direction). The plurality of second openings 512 may be spaced apart from each other at equal intervals. In addition, the plurality of second openings 512 may have the same shape and have the same lengths in first and second directions (x-axis and y-axis directions). That is, the plurality of second openings 512 may have the same shape and regularity having the same lengths in the first and second directions. The second opening 512 may have the same shape as the first opening 511. The second opening 512 may have the same lengths in first and second directions (x-axis and y-axis directions) as the first opening 511. That is, the second opening 512 may be provided in the same shape and size as the first opening 511.

The plurality of second openings 512 may be disposed in a region between the second side surface S2 and the second light source 220. The plurality of second openings 512 may be disposed in a region corresponding to the second side surface S2. The plurality of second openings 512 may be disposed in a region that does not vertically overlap with the second light source 220. The number of the plurality of second openings 512 may be greater than the number of the plurality of second light sources 220.

The plurality of second openings 512 may be disposed in regions corresponding to the plurality of first openings 511. For example, the plurality of second openings 512 may be disposed in regions corresponding to the plurality of first openings 511 in the second direction (y-axis direction). That is, the first opening 511 and the second opening 512 disposed in regions corresponding to each other may be disposed to face each other in the second direction. The number of the plurality of second openings 512 may be the same as the number of the plurality of first openings 511. However, the embodiment is not limited thereto, and the number of the second openings 512 may be greater or less than the number of the first openings 511 according to the shape of a stereoscopic image to be implemented.

Accordingly, a pattern of light emitted through the first opening 511 and the second opening 512 and passing through the optical layer 700 may form a stereoscopic image. In detail, the light may be provided in a linear pattern corresponding to the shape, size, and position of the first opening 511 and the second opening 512. The linear pattern may include a curve. At this time, as the first opening 511 and the second opening 512 have the same shape and size (lengths in the first and second directions), the linear shapes of the light patterns formed through each of the first opening 511 and the second opening 512 may have the same length or width in the first direction.

The first opening 511 and the second opening 512 may be disposed to face each other in the second direction. Accordingly, the linear light pattern formed through each of the first opening 511 and the second opening 512 may provide a stereoscopic image that meets each other in the central region of the light blocking layer 500.

Figure 13:
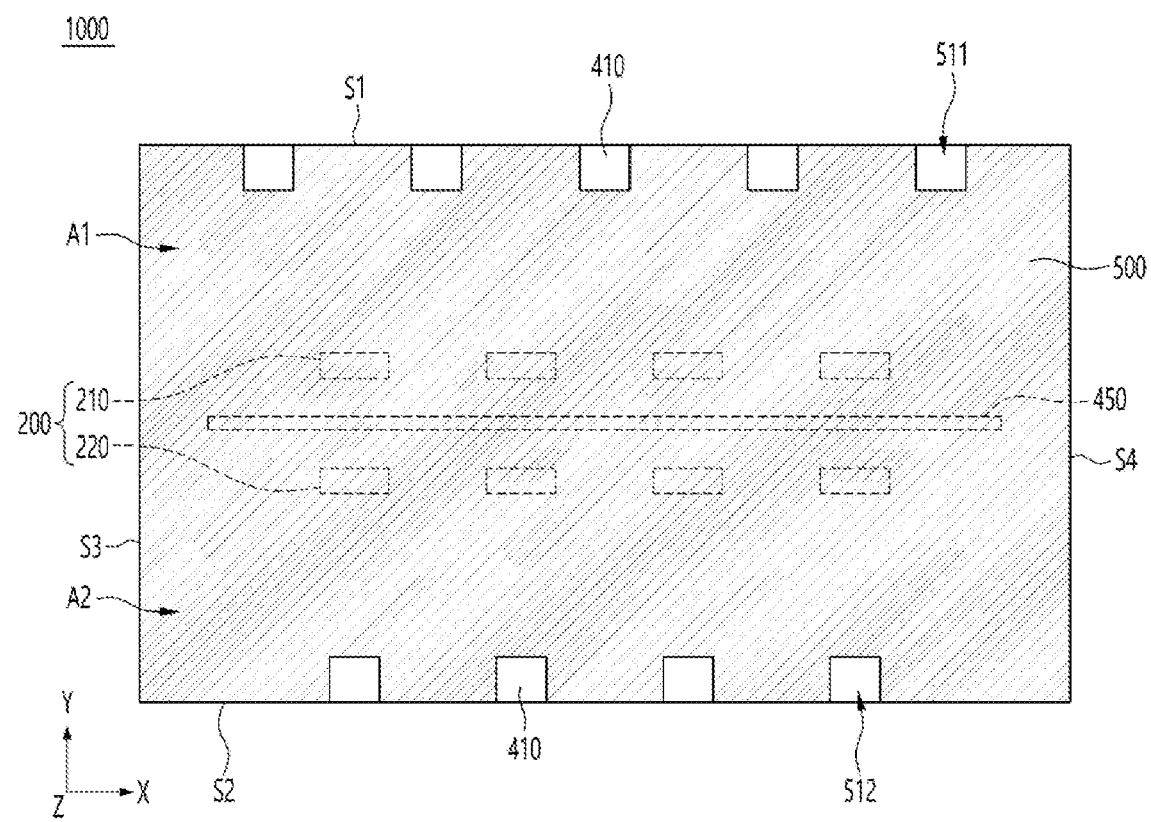

Referring to FIG. 13, the plurality of first openings 511 may be disposed in a region corresponding to the first region A1 of the resin layer 410, and the plurality of second openings 512 may be formed in a region corresponding to the second region A2 of the resin layer 410. In this case, each of the plurality of first openings 511 and the plurality of second openings 512 may be arranged with regularity. For example, the plurality of first openings 511 may have the same shape and regularity having the same length in the first and second directions. Also, the plurality of second openings 512 may have a regularity having the same shape and the same length in the first and second directions. The second opening 512 may have the same shape and size as the first opening 511.

The plurality of second openings 512 may be disposed in a region corresponding to an area between the plurality of first openings 511 spaced apart from each other. In detail, the plurality of second openings 512 may be disposed in a region corresponding to a region between the plurality of first openings 511 spaced apart in a first direction (x-axis direction) and a region corresponding in a second direction (y-axis direction). That is, the first opening 511 and the second opening 512 may not face each other in the second direction and may be disposed in a zigzag shape. In this case, the number of the plurality of second openings 512 may be less than the number of the plurality of first openings 511. However, the embodiment is not limited thereto, and the number of the second openings 512 may be the same as the number of the first openings 511 according to the shape of a stereoscopic image to be implemented.

Accordingly, a pattern of light emitted through the first opening 511 and the second opening 512 and passing through the optical layer 700 may form a stereoscopic image. In detail, the light may be provided in a linear pattern corresponding to the shape, size, and position of the first opening 511 and the second opening 512. The linear pattern may include a curve. In this case, the first opening 511 and the second opening 512 may have the same shape and size (lengths in the first and second directions). Accordingly, the linear shapes of the light patterns formed through each of the first opening 511 and the second opening 512 may have the same length or width in the first direction. The first opening 511 and the second opening 512 may be disposed in a zigzag shape without facing each other in the second direction. Accordingly, the light pattern formed through each of the first opening 511 and the second opening 512 may provide a stereoscopic image in a zigzag shape.

Figure 14:
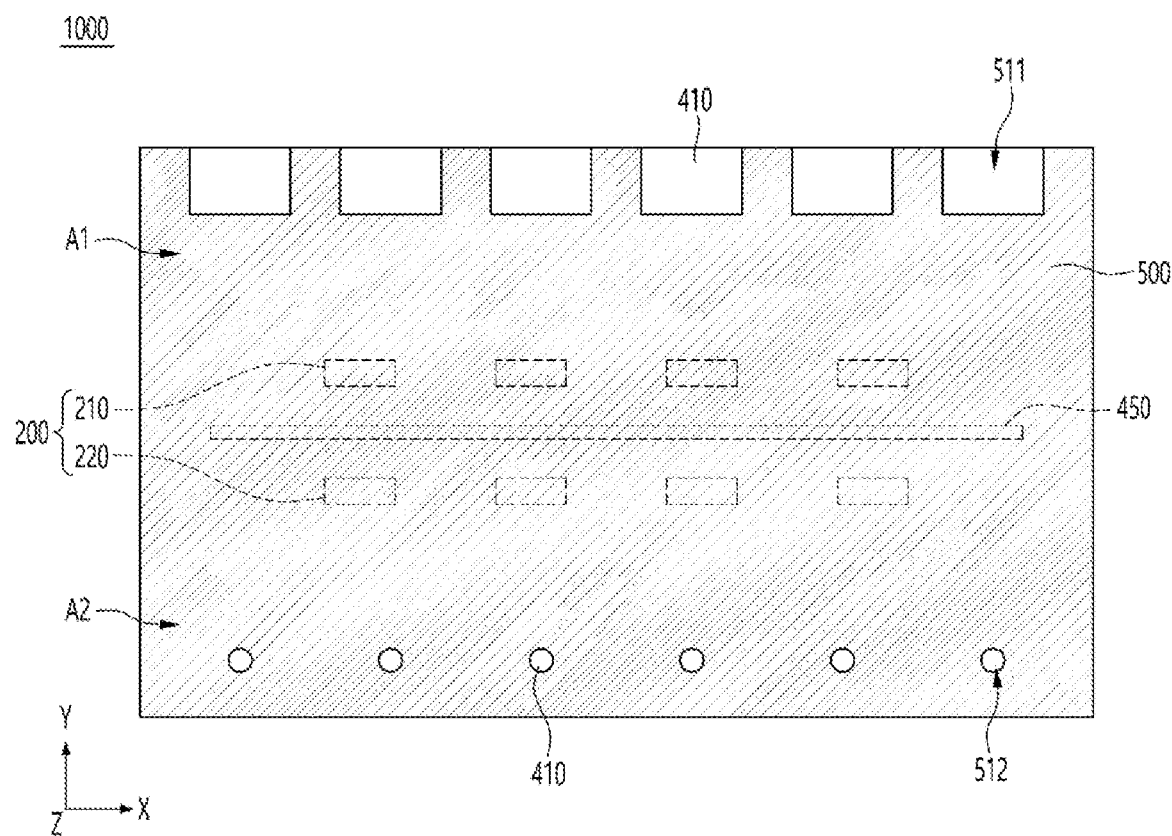

Referring to FIG. 14, the plurality of first openings 511 may be disposed in a region corresponding to the first region A1 of the resin layer 410, and the plurality of second openings 512 may be formed in a region corresponding to the second region A2 of the resin layer 410. In this case, each of the plurality of first openings 511 and the plurality of second openings 512 may be arranged with regularity. For example, the plurality of first openings 511 may have the same shape and regularity having the same length in the first and second directions. Also, the plurality of second openings 512 may have a regularity having the same shape and the same length in the first and second directions.

The plurality of second openings 512 may be disposed in regions corresponding to the plurality of first openings 511. For example, the plurality of second openings 512 may be disposed in regions corresponding to the plurality of first openings 511 in the second direction (y-axis direction). That is, the first opening 511 and the second opening 512 disposed in regions corresponding to each other may be disposed to face each other in the second direction. The number of the plurality of second openings 512 may be the same as the number of the plurality of first openings 511. However, the embodiment is not limited thereto, and the number of the second openings 512 may be greater or less than the number of the first openings 511 according to the shape of a stereoscopic image to be implemented.

The second opening 512 may have a shape different from that of the first opening 511. For example, as shown in FIG. 14, the first opening 511 may have a rectangular shape, and the second opening 512 may have a circular shape. Also, the second opening 512 may have a smaller size than the first opening 511. For example, the second opening 512 may have smaller lengths W5 and W6 in the first and second directions (x-axis and y-axis) than the first opening 511.

Accordingly, a pattern of light emitted through the first opening 511 and the second opening 512 and passing through the optical layer 700 may form a stereoscopic image. In detail, the light may be provided in a linear pattern corresponding to the shape, size, and position of the first opening 511 and the second opening 512. The linear pattern may include a curve. At this time, as the first opening 511 and the second opening 512 have different shapes and sizes (lengths in the first and second directions), the linear shapes of the light patterns formed through each of the first opening 511 and the second opening 512 may have different lengths or widths in the first direction. The first opening 511 and the second opening 512 may be disposed to face each other in the second direction. Accordingly, the linear light pattern formed through each of the first opening 511 and the second opening 512 may provide a stereoscopic image that meets each other in the central region of the light blocking layer 500.

Figure 15:
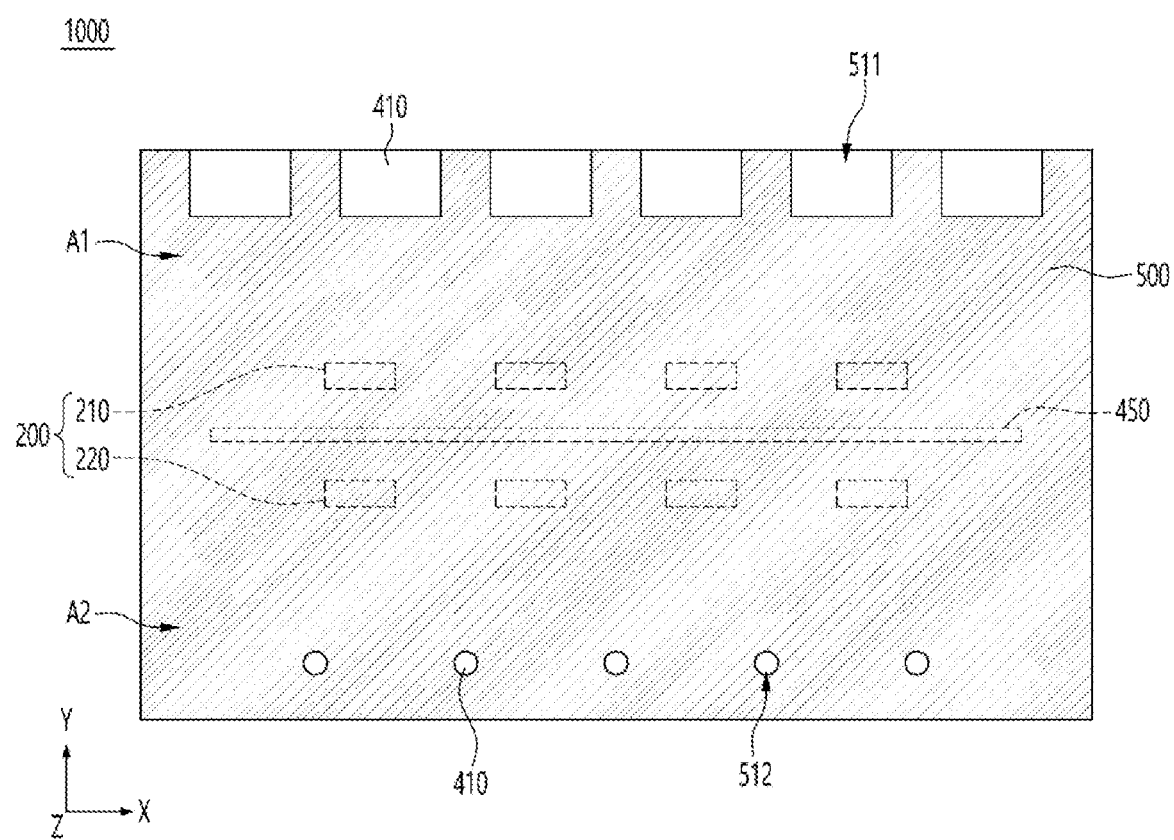

Referring to FIG. 15, the plurality of first openings 511 may be disposed in a region corresponding to the first region A1 of the resin layer 410, and the plurality of second openings 512 may be disposed in a region corresponding to the second region A2 of the resin layer 410. In this case, each of the plurality of first openings 511 and the plurality of second openings 512 may be arranged with regularity. For example, the plurality of first openings 511 may have the same shape and regularity having the same length in the first and second directions. Also, the plurality of second openings 512 may have a regularity having the same shape and the same length in the first and second directions.

The plurality of second openings 512 may be disposed in a region corresponding to an area between the plurality of first openings 511 spaced apart from each other. In detail, the plurality of second openings 512 may be disposed in a region corresponding to a region between the plurality of first openings 511 spaced apart in a first direction (x-axis direction) and a second direction (y-axis direction). That is, the first opening 511 and the second opening 512 may not face each other in the second direction and may be disposed in a zigzag shape. In this case, the number of the plurality of second openings 512 may be less than the number of the plurality of first openings 511. However, the embodiment is not limited thereto, and the number of the second openings 512 may be the same as the number of the first openings 511 according to the shape of a stereoscopic image to be implemented. The second opening 512 may have a shape different from that of the first opening 511. For example, as shown in FIG. 15, the first opening 511 may have a rectangular shape, and the second opening 512 may have a circular shape. Also, the second opening 512 may have a smaller size than the first opening 511. For example, the second opening 512 may have smaller lengths W5 and W6 in the first and second directions (x-axis and y-axis) than the first opening 511.

Accordingly, a pattern of light emitted through the first opening 511 and the second opening 512 and passing through the optical layer 700 may form a stereoscopic image. In detail, the light may be provided in a linear pattern corresponding to the shape, size, and position of the first opening 511 and the second opening 512. The linear pattern may include a curve. At this time, as the first opening 511 and the second opening 512 have different shapes and sizes (lengths in the first and second directions), the linear shapes of the light patterns formed through each of the first opening 511 and the second opening 512 may have different lengths or widths in the first direction.

The first opening 511 and the second opening 512 may be disposed in a zigzag shape without facing each other in the second direction. Accordingly, the light pattern formed through each of the first opening 511 and the second opening 512 may provide a stereoscopic image in a zigzag shape.

Figure 16:
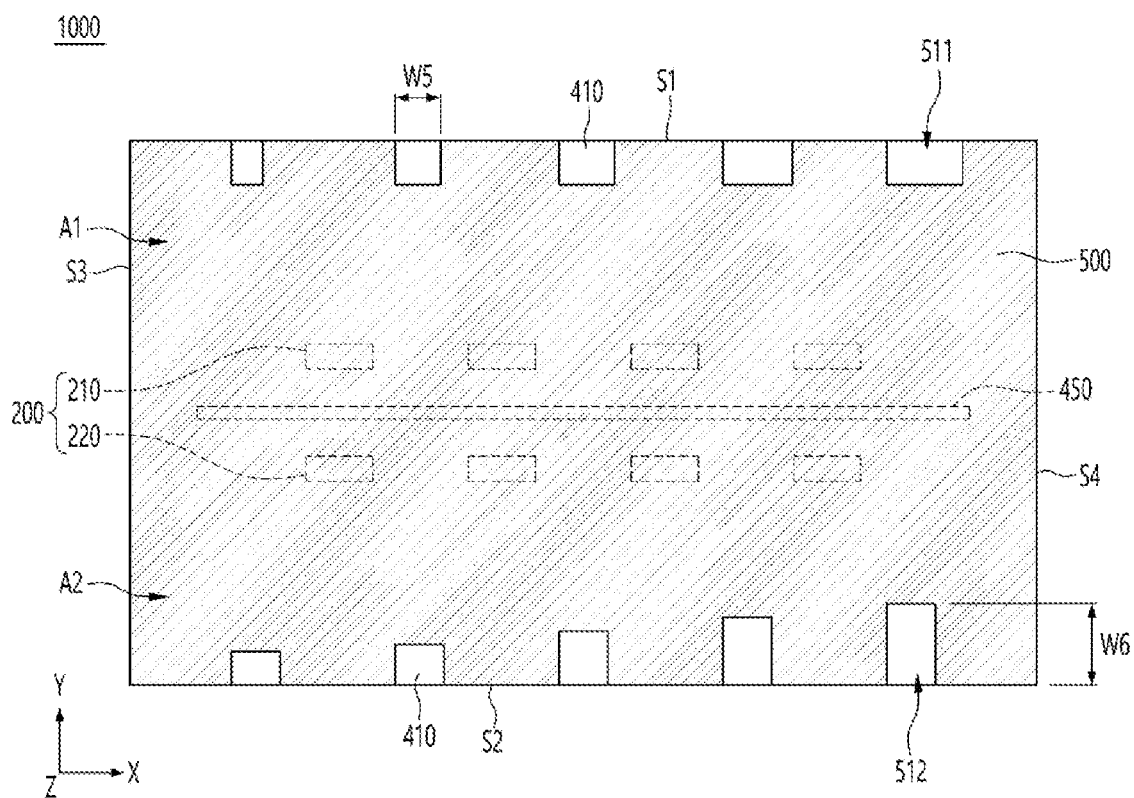

Referring to FIG. 16, the plurality of first openings 511 may be disposed in a region corresponding to the first region A1 of the resin layer 410, and the plurality of second openings 512 may be disposed in a region corresponding to the second region A2 of the resin layer 410. In this case, each of the plurality of first openings 511 and the plurality of second openings 512 may be arranged with regularity. In detail, the plurality of first openings 511 may have the same shape as each other. The plurality of first openings 511 may have regularity in which lengths W5 in the first direction change. For example, the first direction length W5 of the first opening 511 may be gradually increased from a first light source (leftmost in the drawing) disposed first among the plurality of first light sources 210 toward the first light source (rightmost in the drawing) disposed last.

The plurality of second openings 512 may have the same shape. The plurality of second openings 512 may have regularity in which the length W6 in the second direction changes. For example, the second direction length W6 of the second opening 512 may be gradually increased from the second light source disposed first among the plurality of second light sources 220 (leftmost in the drawing) toward the second light source (rightmost in the drawing) disposed last.

A length of at least one of the plurality of first openings 511 in a first direction (x-axis direction) may be greater than a length of at least one of the plurality of second openings 512 in the first direction. In addition, a length of at least one of the plurality of second openings 512 in a second direction (y-axis direction) may be greater than a length of at least one of the plurality of first opening 511 in the second direction (y-axis direction). The plurality of second openings 512 may be disposed in regions corresponding to the plurality of first openings 511. For example, the plurality of second openings 512 may be disposed in regions corresponding to the plurality of first openings 511 in the second direction (y-axis direction). That is, the first opening 511 and the second opening 512 disposed in regions corresponding to each other may be disposed to face each other in the second direction. Also, although not shown in the drawings, the plurality of second openings 512 may be disposed in a region corresponding to a region between the plurality of first openings 511 spaced apart in the first direction and in the second direction. That is, the plurality of first openings 511 and the plurality of second openings 512 may be arranged in a zigzag shape.

The number of the plurality of second openings 512 may be the same as the number of the plurality of first openings 511. However, the embodiment is not limited thereto, and the number of the second openings 512 may be greater or less than the number of the first openings 511 according to the shape of a stereoscopic image to be implemented.

Accordingly, a pattern of light emitted through the first opening 511 and the second opening 512 and passing through the optical layer 700 may form a stereoscopic image. In detail, the light may be provided in a linear pattern corresponding to the shape, size, and position of the first opening 511 and the second opening 512. The linear pattern may include a curve. In this case, the plurality of first openings 511 may have different first direction lengths W5, and the plurality of second openings 512 may have different second direction lengths W6. Accordingly, the linear shape of the light pattern formed through each of the first opening 511 and the second opening 512 may have different luminous intensity, a length or a width in the first direction, and the like.

The lighting device 1000 according to the embodiment may form a linear stereoscopic image by using a point light source of uniform intensity emitted through each of the first and second openings 511 and 512. In this case, the light pattern having the linear shape may include a curve, and may have a shape corresponding to the shape, size, and position of the first opening 511 and the second opening 512. The number of the linear shapes may be less than or equal to the sum of the number of the first openings 511 and the second openings 512. In detail, the light emitted from each of the first opening 511 and the second opening 512 may pass through the optical layer 700 to form a linear shape, respectively. In this case, the linear light pattern formed according to the shape, size, and position of the first opening 511 and the second opening 512 may overlap each other in one region. Accordingly, when a person visually recognizes a light pattern having a linear shape from the outside of the lighting device 1000, the number of linear shapes may be less than the number of the opening portions.

The resin layer 410 according to the embodiment may include a groove 450 formed between the first region A1 and the second region A2. Accordingly, when the first and second light sources 210 and 220 emit light at the same time, the light emitted from each of the first and second light sources 210 and 220 may be prevented or minimized from travelling the second and first regions A2 and A1, respectively. In addition, when one light source selected from among the first and second light sources 210 and 220 emits light, it is possible to prevent or minimize light from travelling to a region of the resin layer 410 that does not correspond to the light emitting light source. Accordingly, the lighting device 1000 according to the embodiment may prevent the light emitted from each of the first and second light sources 210 and 220 from mixing, so that a set stereoscopic image, for example, a curved stereoscopic image, may provide more clearly defined.

FIGS. 17*a* and 17*b* to FIGS. 20*a* and 20*b* are diagrams for explaining stereoscopic images formed according to various opening portion shapes in a lighting device according to an embodiment.

Figure 17A:
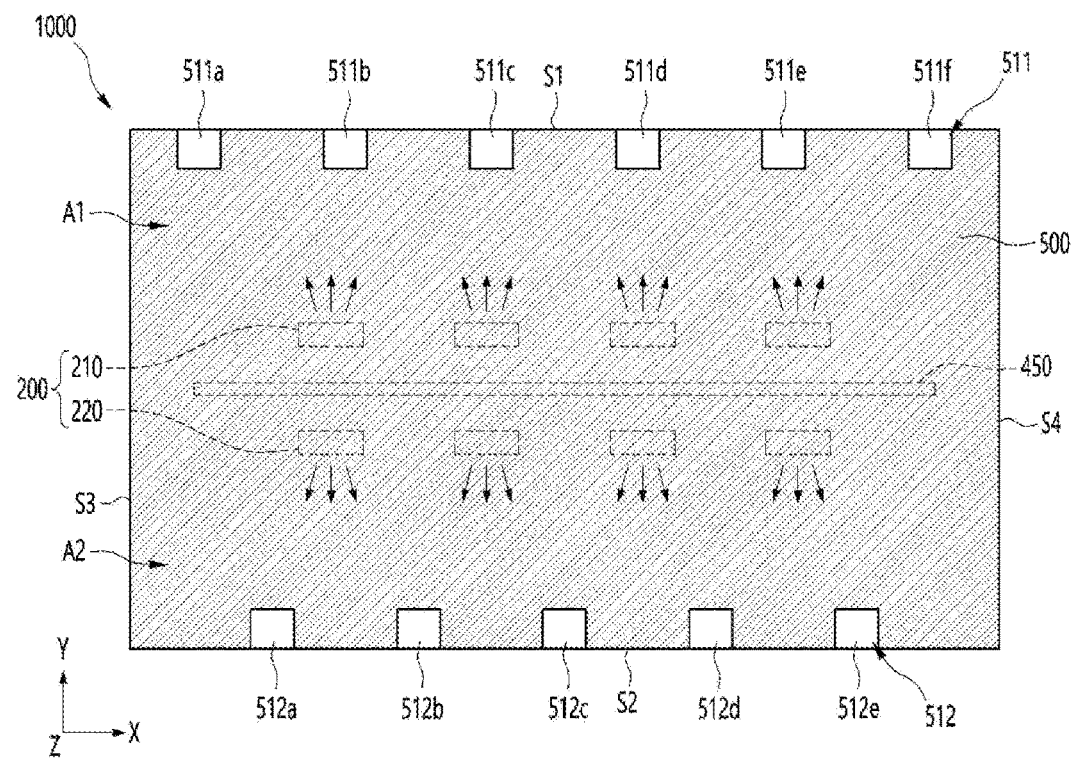
FIGS. 17a to 20b are diagrams for explaining stereoscopic images formed according to various opening shapes in a lighting device according to an embodiment.
Figure 17B:
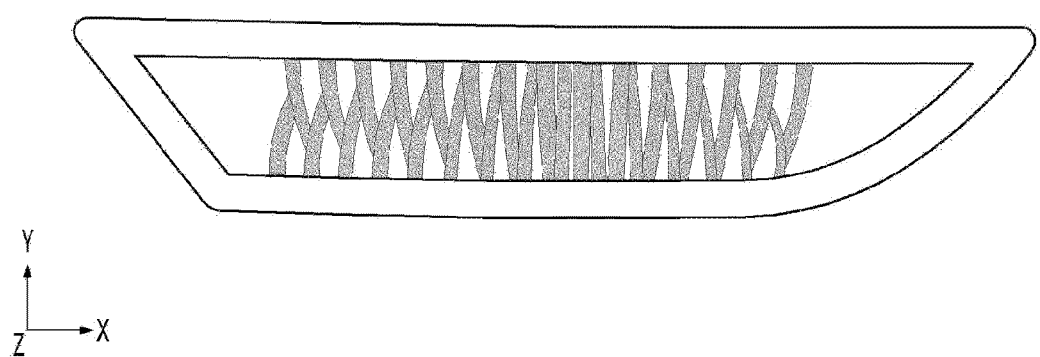

Referring to FIGS. 17*a* and 17*b*, the light blocking layer 500 may include an opening portion 510 including a plurality of openings. The plurality of openings may include a plurality of first openings 511 disposed in a region corresponding to the first region A1 of the resin layer 410 and a plurality of second opening 512 disposed in a region corresponding to the second region A2 of the resin layer 410. The plurality of first openings 511 may include a 1-1 to 1-6 openings 511*a* to 511*f* that are spaced apart from each other in the first direction. The 1-1 to 1-6 openings 511*a* to 511*f* may have the same shape and regularity having the same length in the first and second directions. The plurality of second openings 512 may include a 2-1 to 2-5 openings 512*a* to 512*e* that are spaced apart from each other in the first direction. The 2-1 to 2-5 openings 512*a* to 512*e* may have the same shape and regularity having the same length in the first and second directions.

The plurality of second openings 512 may be disposed in a region corresponding to a region between the plurality of first openings 511 spaced apart from each other. In detail, the plurality of second openings 512 may be disposed in a region corresponding to a region between the plurality of first openings 511 spaced apart in a first direction (x-axis direction) and a second direction (y-axis direction). That is, the first opening 511 and the second opening 512 may not face each other in the second direction and may be disposed in a zigzag shape. Accordingly, a pattern of light emitted through each of the first opening 511 and the second opening 512 and passing through the optical layer 700 may have a shape in which a linear stereoscopic image intersects in a zigzag manner. In this case, the linear shape of the light pattern may include a curve. In detail, the light emitted through the first opening 511 may have a linear shape extending from the first side surface S1 adjacent to the first opening 511 to the second side surface S2 direction. In this case, in the light pattern, a first direction width of a region adjacent to the first side surface S1 may be greater than a first direction width of a region adjacent to the second side surface S2. That is, the luminous intensity of the light pattern may decrease as it moves away from the first opening 511. Accordingly, when the light pattern is viewed from the outside, it may be recognized that the width in the first direction gradually decreases from the first side surface S1 to the second side surface S2.

The light emitted through the second opening 512 may have a linear shape extending from the second side surface S2 adjacent to the second opening 512 in the direction of the first side surface S1. In this case, in the light pattern, the width in the first direction of the region adjacent to the second side surface S2 may be greater than the width in the first direction of the region adjacent to the first side surface S1. That is, the light intensity of the light pattern may decrease as it moves away from the second opening 512. Accordingly, when the light pattern is viewed from the outside, it may be recognized that the width in the first direction gradually decreases from the second side surface S2 to the first side surface S1.

Figure 18A:
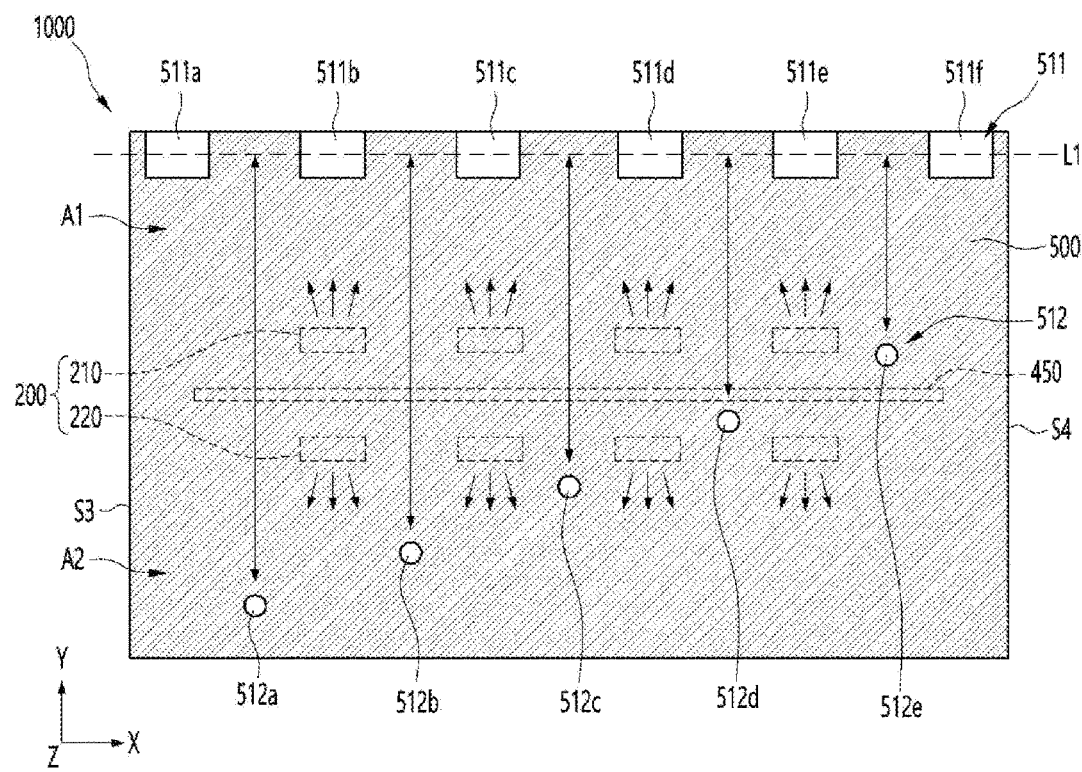
Figure 18B:
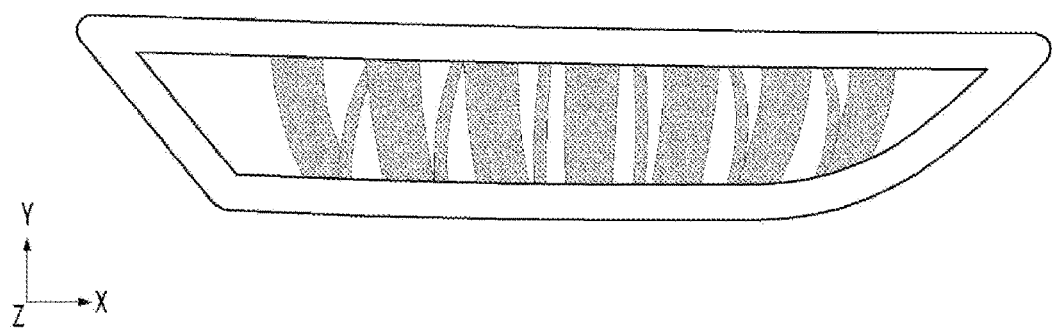

Referring to FIGS. 18*a* and 18*b*, the light blocking layer 500 may include an opening portion 510 including a plurality of openings. The plurality of openings may include a plurality of first openings 511 disposed in a region corresponding to the first region A1 of the resin layer 410, and a plurality of second openings 512 disposed in a region corresponding to the second region A2 of the resin layer 420. The plurality of first openings 511 may include a 1-1 to 1-6 openings 511a to 511f that are spaced apart from each other in the first direction. The 1-1 to 1-6 openings 511a to 511f may have the same shape and regularity having the same length in the first and second directions. The plurality of second openings 512 may include a 2-1 to 2-5 openings 512a to 512e that are spaced apart from each other in a direction (diagonal direction) between the first and second directions. Accordingly, a portion of the plurality of second openings 512 may be disposed in a region corresponding to the first region A1, and the remainder may be disposed in a region corresponding to the second region A2. The 2-1 to 2-5 openings 512a to 512e may have the same shape and regularity having the same length in the first and second directions.

The plurality of second openings 512 may be disposed in a region corresponding to a region between the plurality of first openings 511 spaced apart from each other. In detail, the plurality of second openings 512 may be disposed in a region corresponding to a region between the plurality of first openings 511 spaced apart in a first direction (x-axis direction) and a second direction (y-axis direction). That is, the first opening 511 and the second opening 512 may not face each other in the second direction and may be disposed in a zigzag shape. A distance between the plurality of second openings 512 and the first side surface S1 may vary. In detail, a virtual straight line L1 connecting the centers of the plurality of first openings 511 may be included. The virtual straight line L1 may extend in the first direction. In this case, an interval between each of the plurality of second openings 512 and the virtual straight line L1, for example, a length in the second direction may be different from each other. For example, a length in the second direction between the virtual straight line L1 and the second opening 512 may become smaller from the 2-1 opening 512a disposed first among the plurality of second openings 512 toward 2-5 opening 512e disposed last.

Accordingly, a pattern of light emitted through each of the first opening 511 and the second opening 512 and passing through the optical layer 700 may have a shape in which a linear stereoscopic image intersects in a zigzag manner. In this case, the linear shape of the light pattern may include a curve. In detail, the light emitted through the first opening 511 may have a linear shape extending from the first side surface S1 adjacent to the first opening 511 to the second side surface S2 direction. In addition, as the second opening 512 is formed to have a different distance from the virtual straight line L1, the light emitted through the second opening 512 may have a linear shape with different curvature and curved shape. At this time, as the size of the second opening 512 is smaller than that of the first opening 511, a width (length in the first direction) of the light pattern formed through the second opening 512 may be smaller than that of formed through the first opening 511.

Figure 19A:
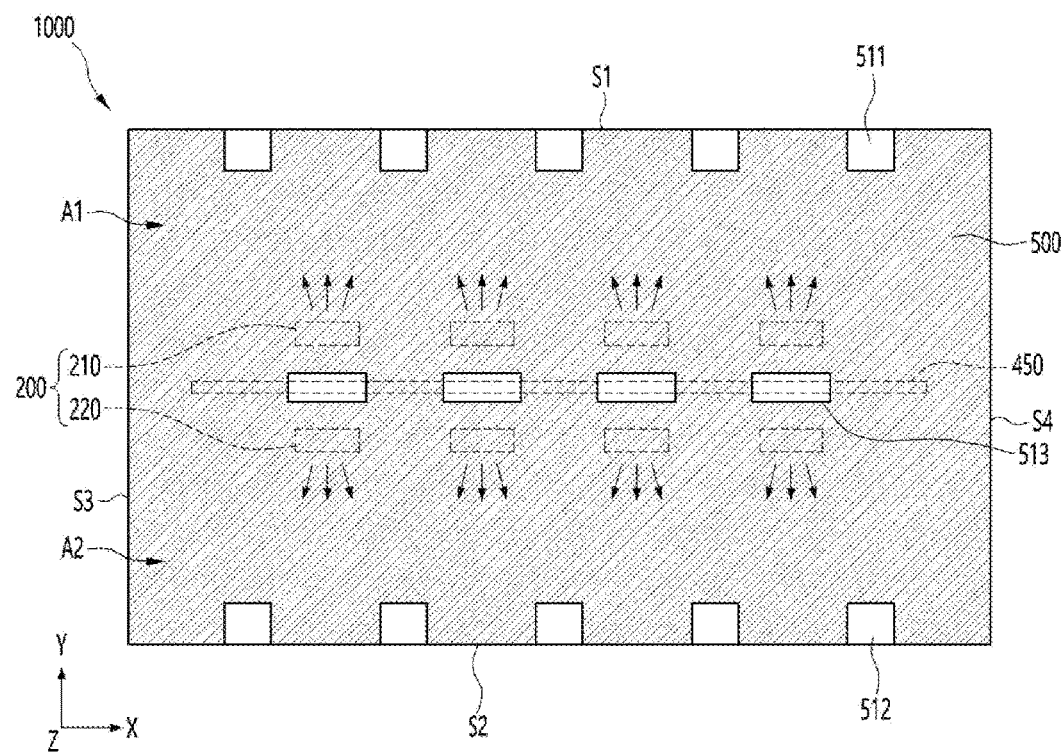
Figure 19B:
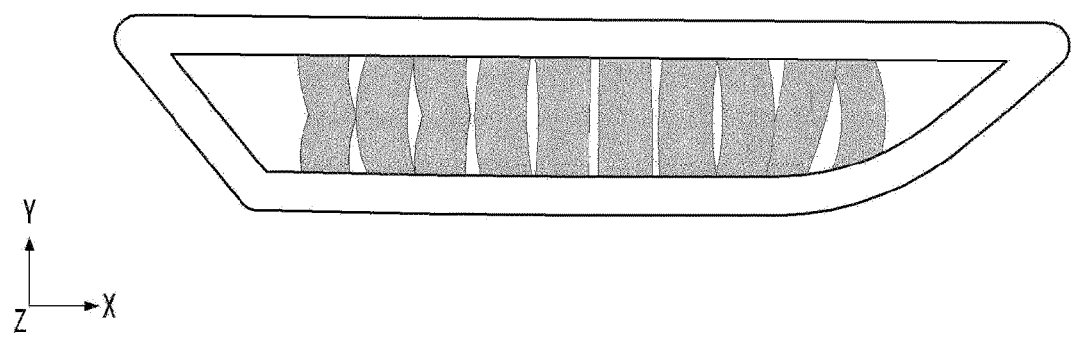

Referring to FIGS. 19a and 19b, the light blocking layer 500 may include an opening 510 including a plurality of openings. The plurality of openings may include to a plurality of first openings 511 disposed in a region corresponding to the first region A1 of the resin layer 410 and a plurality of second openings 512 disposed in the region corresponding to the second region A2 of the resin layer 410. The plurality of first openings 511 may be arranged with regularity in the first region A1, and the plurality of second openings 512 may be arranged with regularity in the second region A2. The plurality of openings may further include a plurality of third openings 513 disposed in a region between the first opening 511 and the second opening 512. The third opening 513 may be disposed in a central region (based on the second direction) of the light blocking layer 500. A partial region of the third opening 513 may be disposed in a region corresponding to at least one of the first region A1 and the second region A2. The third opening 513 may be disposed in a region overlapping the groove 450 of the resin layer 410 in the vertical direction (z-axis direction). The plurality of first openings 511 and the plurality of second openings 512 may be disposed in regions corresponding to each other in the second direction (y-axis direction). That is, the first opening 511 and the second opening 512 may be disposed to face each other in the second direction. The plurality of third openings 513 may be disposed in regions respectively corresponding to a region between the plurality of first openings 511 and a region between the plurality of second openings 512 spaced apart from each other. In detail, the plurality of third openings 513 may be disposed in a region between the plurality of first openings 511 spaced apart from each other in a first direction (x-axis direction), and disposed in a region corresponding to a region between the plurality of second openings 512 in the second direction (y-axis direction). That is, the first opening 511 and the third opening 513, the second opening 512 and the third opening 513 may be arranged in a zigzag shape without facing each other in the second direction.

Accordingly, a pattern of light emitted through each of the first opening 511 and the second opening 512 and passing through the optical layer 700 may form a linear stereoscopic image including a curve. In this case, the first opening 511 and the second opening 512 may be disposed to face each other in the second direction. Accordingly, the linear light pattern formed through each of the first opening 511 and the second opening 512 may provide a stereoscopic image that meets each other in the central region of the light blocking layer 500. In detail, the stereoscopic image may have a concave shape toward the central region of the light blocking layer 500. In addition, the stereoscopic image may have a shape in which the luminous intensity decreases toward the central region of the light blocking layer 500.

A portion of the light emitted from the light source portion 200 may be transmitted to the optical layer 700 through the third opening 513. Thereafter, the light may pass through the optical layer 700 to form a linear stereoscopic image including a curve. In this case, the linear light pattern formed through the third opening 513 may have a shape extending in the direction of the first and second side surfaces S1 and S2 of the resin layer 410 in the central region of the light blocking layer 500. In addition, the light pattern may have a symmetrical shape with respect to the central region of the light blocking layer 500 and form a stereoscopic image in which the central region has a convex shape. In addition, the stereoscopic image may have a form in which the luminous intensity decreases as the distance from the central region of the light blocking layer 500 increases.

Figure 20A:
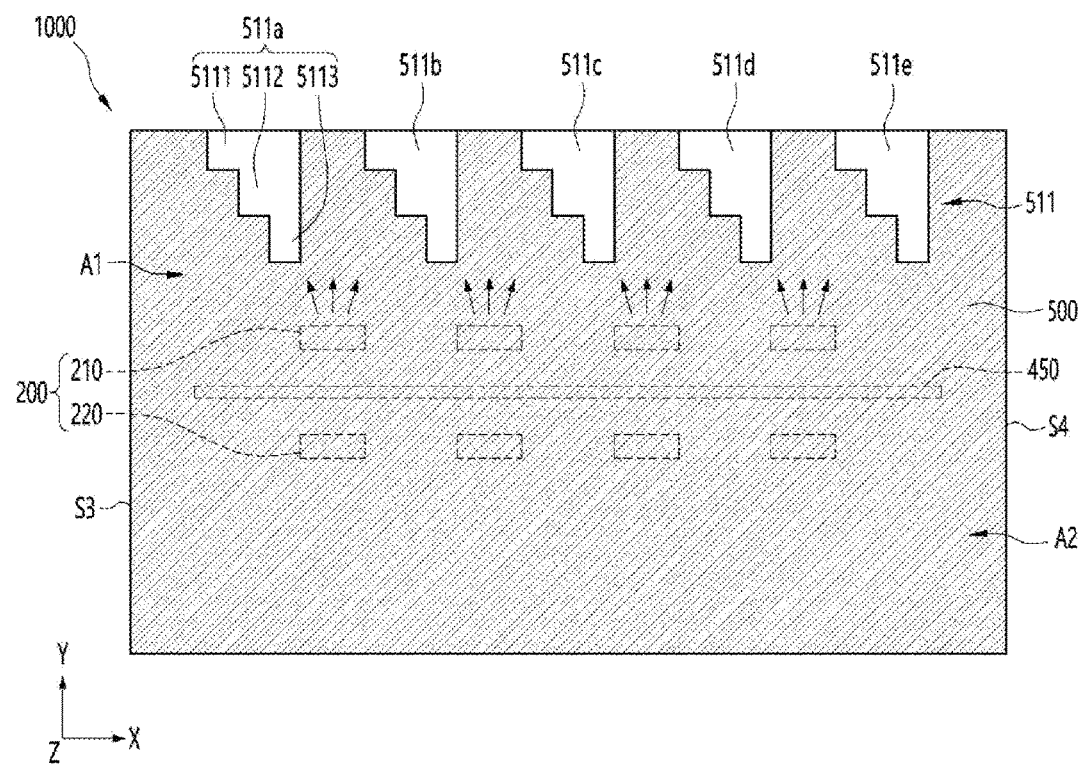
Figure 20B:
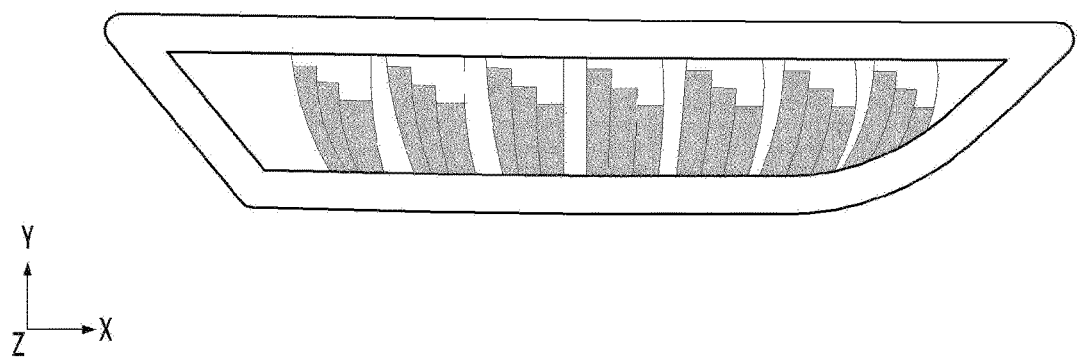

Referring to FIGS. 20a and 20b, the light blocking layer 500 may include an opening portion 510 including a plurality of openings. The plurality of openings may include a plurality of first openings 511 disposed in a region corresponding to the first region A1 of the resin layer 410. The plurality of first openings 511 may be arranged in the first region A1 with regularity. At least one first opening among the plurality of first openings 511 may include a plurality of unit openings. For example, the first opening 511 may include a first unit opening 5111, a second unit opening 5112, and a third unit opening 5113. The first unit opening 5111 may be spaced apart from the third unit opening 5113 in a first direction. The second unit opening 5112 may be disposed between the first and third unit openings 5111 and 5113, and may connect the two unit openings 5111 and 5113. Accordingly, the first to third unit openings 5111, 5112, and 5113 may be connected to each other.

The first to third unit openings 5111, 5112, and 5113 may have a set size. For example, each of the first to third unit openings 5111, 5112, and 5113 may have the same length in the first direction. Also, lengths in the second direction of each of the first to third unit openings 5111, 5112, and 5113 may be different from each other. In detail, the second unit opening 5112 may have a length greater in a second direction than that of the first unit opening 5111, and the third unit opening 5113 may have a length greater than that of the second unit opening 5112 in a second direction.

Accordingly, a pattern of light emitted through each of the first to third unit openings 5111, 5112, and 5113 and passing through the optical layer 700 may form a stereoscopic image having a linear shape. In this case, the linear shape of the light pattern may include a curve. In detail, the light emitted through each of the first to third unit openings 5111, 5112, and 5113 may have a liner shape extending from the first side surface S1 adjacent to the first opening 511 to the second side surface S2 direction. In addition, the luminous intensity of the light pattern may decrease as it moves away from the first opening 511. Accordingly, when the light pattern is viewed from the outside, it may be recognized that the width in the first direction gradually decreases from the first side surface S1 to the second side surface S2. Also, in the lighting device 1000, lengths in the second direction of the first to third unit openings 5111, 5112, and 5113 may be different. Accordingly, the light pattern of the first unit opening 5111 having a relatively short length in the second direction may be shorter than a length of the third unit opening 5113 having a relatively long length in the second direction.

Referring to FIGS. 20*a* and 20*b*, the opening portion 510 may be disposed only in a region corresponding to the first region A1. That is, separate opening portions may not be formed in the second region A2 and the central region of the light blocking layer 500. In this case, the second light source 220 disposed in the second region A2 may not emit light. Alternatively, although not shown in the drawings, the second light source 220 may be omitted.

The lighting device 1000 according to the embodiment may provide a stereoscopic image having a linear shape using a point light source of uniform intensity emitted through the opening portion 510 formed in the light blocking layer 500. In particular, the lighting device 1000 may provide a stereoscopic image having various shapes by controlling the shapes, sizes, positions, etc. of the plurality of opening portions included in the opening portions 510. The lighting device 1000 includes a resin layer 410 for guiding the light emitted from the light source portion 200, and the resin layer 410 may include a groove 450 extending in one direction between a plurality of light sources. Accordingly, the lighting device 1000 may minimize light loss and prevent or minimize the movement of light emitted from a set area to another region, thereby providing a clearer stereoscopic image.

Figure 21:
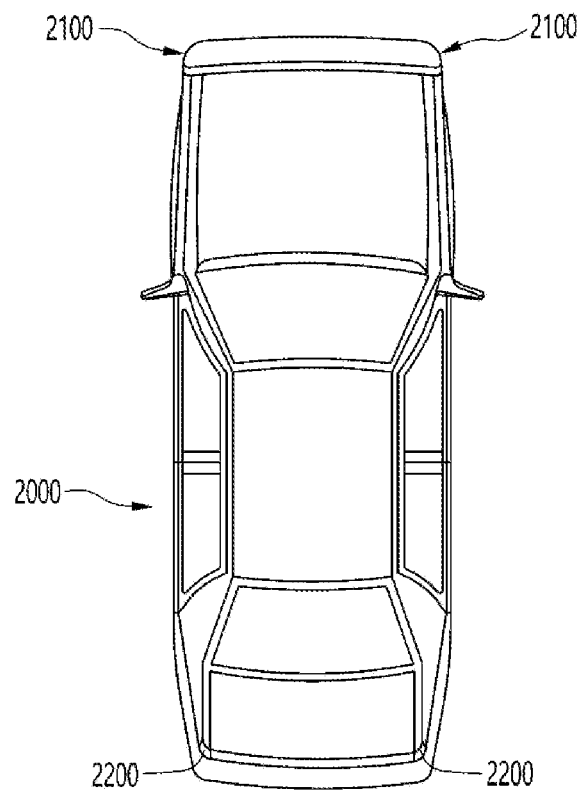
FIGS. 21 to 23 are diagrams illustrating examples in which a lamp including a lighting device according to an embodiment is applied to a vehicle.
Figure 22:
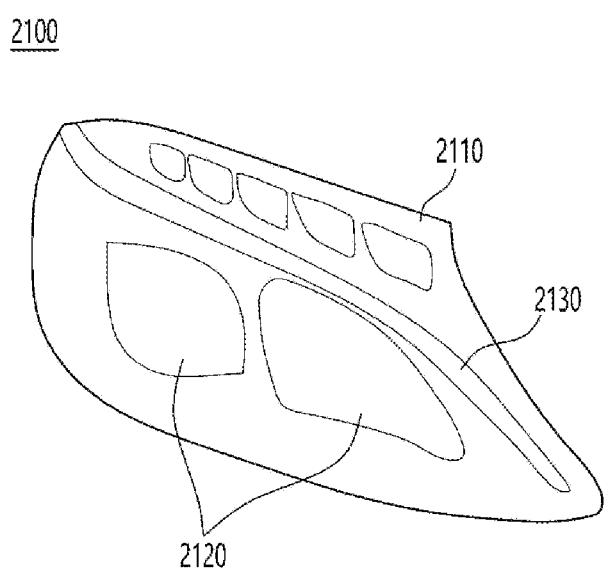
Figure 23:
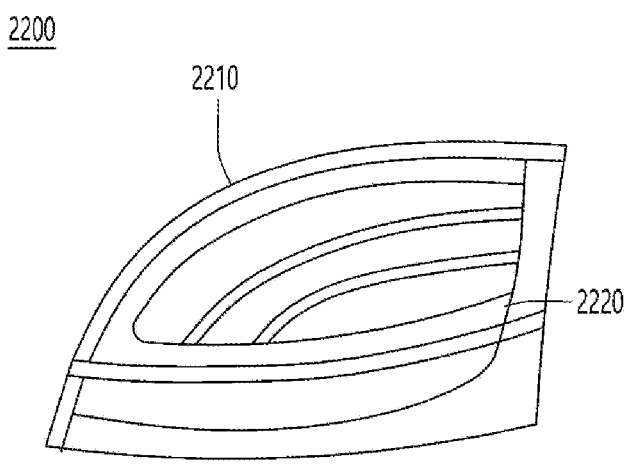

FIGS. 21 to 23 are diagrams illustrating examples in which a lamp including a lighting device according to an embodiment is applied to a vehicle. In detail, FIG. 21 is a top view of a vehicle to which a lamp having the lighting device is applied, FIG. 22 is an example in which the lighting device according to the embodiment is disposed in front of the vehicle, and FIG. 23 is an example disposed in the rear of the lighting device according to the embodiment of the vehicle.

Referring to FIGS. 21 to 23, the lighting device 1000 according to the embodiment may be applied to a vehicle 2000. One or more lamps may be disposed in at least one of a front, a rear, and a side of the vehicle 2000. For example, referring to FIG. 22, a lamp including the lighting device 1000 may be applied to a front lamp 2100 of a vehicle. The front lamp 2100 may include a first cover member 2110 and at least one first lamp module 2120 including the lamp. The first cover member 2110 accommodates the first lamp module 2120 and may be made of a light-transmitting material. The first cover member 2110 may have a curve according to the design of the vehicle 2000, and may be provided as a flat surface or a curved surface according to the shape of the first lamp module 2120. The front lamp 2100 may provide a plurality of functions by controlling the driving timing of the lighting device 1000 included in the first lamp module 2120. For example, the front lamp 2100 may provide at least one function of a headlamp, a turn indicator, a daytime running lamp, a high beam, a low beam, and a fog lamp by light emission of the lighting device 1000. In addition, the front lamp 2100 may provide additional functions such as a welcome light or a celebration effect when the driver opens the vehicle door, and it may provide information to a vehicle or person located in the front or side by forming a signal or the like. In this case, the light emitted from the front lamp 2100 may be emitted in the form of a stereoscopic image.

Referring to FIG. 23, the lamp including the lighting device 1000 may be applied to a rear lamp 2200 of a vehicle. The rear lamp 2200 may include a second cover member 2210 and at least one second lamp module 2220 including the lamp.

The second cover member 2210 accommodates the second lamp module 2220 and may be made of a light-transmitting material. The second cover member 2210 may have a curve according to the design of the vehicle 2000, and may be provided as a flat surface or a curved surface according to the shape of the second lamp module 2220. The rear lamp 2200 may provide a plurality of functions by controlling the driving timing of the lighting device 1000 included in the second lamp module 2220. For example, the rear lamp 2200 may provide at least one function of a sidelight, a brake light, and a turn indicator light by the light emission of the lighting device 1000, and it may provide information to a vehicle or person located in the front or side by forming a signal or the like. In this case, the light emitted from the rear lamp 2200 may be emitted in the form of a stereoscopic image. Here, the stereoscopic image may be an image recognized when a person sees the front lamp 2100 and/or the rear lamp 2200 from the outside of the vehicle 2000. The stereoscopic image is implemented as a contrast between the brightest region and the darkest region by the opening portion 510 and the optical layer 700 or provides a three-dimensional effect in a three-dimensional form by using the depth or difference of luminous intensity.

Features, structures, effects, etc. described in the above embodiments are included in at least one embodiment of the invention, and are not necessarily limited to only one embodiment. Furthermore, features, structures, effects, etc. illustrated in each embodiment may be combined or modified for other embodiments by those of ordinary skill in the art to which the embodiments belong. Accordingly, the contents related to such combinations and modifications should be interpreted as being included in the scope of the invention.

In addition, although the embodiment has been described above, it is only an example and does not limit the invention, and those of ordinary skill in the art to which the invention pertains are exemplified above in a range that does not depart from the essential characteristics of the present embodiment. It may be seen that various modifications and applications that have not been made are possible. For example, each component specifically shown in the embodiment may be implemented by modification. And the differences related to these modifications and applications should be construed as being included in the scope of the invention defined in the appended claims.

The invention claimed is:

1. A lighting device comprising:
a substrate;
a light source unit disposed on the substrate;
a resin layer disposed on the substrate and covering the light source portion;
a light blocking layer disposed on the resin layer and having an opening portion; and
an optical layer disposed on the light blocking layer,
wherein the light source portion include a plurality of first light sources disposed in a first region of the resin layer and a plurality of second light sources disposed in a second region of the resin layer,
wherein the resin layer includes a groove disposed between the first and second regions,
wherein the resin layer includes first and second side surfaces facing in a second direction, and third and fourth side surfaces facing in a first direction, wherein the first direction is orthogonal to the second direction, and
wherein the plurality of first light sources is disposed between the first side surface of the resin layer and the groove.

2. The lighting device of claim 1,
wherein a light emitting surface of each of the plurality of first light sources faces the first side surface of the resin layer, and
wherein a light emitting surface of each of the plurality of second light sources faces the second side surface of the resin layer.

3. The lighting device of claim 2,
wherein the plurality of second light sources is disposed between the second side surface of the resin layer and the groove.

4. The lighting device of claim 3, wherein the resin layer includes a connection portion disposed between the first and second regions and connecting the first and second regions, and
wherein a length of the first direction of the connection portion is 2 mm or more.

5. The lighting device of claim 3, wherein the plurality of first light sources is spaced apart from each other in the first direction, and
wherein the plurality of second light sources is spaced apart from each other in the first direction.

6. The lighting device of claim 5, wherein a length of the first direction of the groove is longer than a length of the first direction of the first region in which the plurality of first light sources is disposed, and
wherein the length in the first direction of the first region in which the plurality of first light sources is disposed is a length in the first direction from one end of a light source arranged first among the plurality of first light sources to the other end of a light source arranged last.

7. The lighting device of claim 2, wherein the opening portion include: a plurality of first openings arranged with regularity; and a plurality of second openings having regularity and being spaced apart from the plurality of first openings.

8. The lighting device of claim 7, wherein each of the plurality of second openings is disposed in a region corresponding to a region corresponding to the plurality of first openings in the second direction or a region corresponding to a region between the plurality of first openings.

9. The lighting device of claim 7, wherein the opening portion includes a plurality of third openings disposed in a central region of the light blocking layer,
wherein the plurality of third openings overlaps the groove in a vertical direction, and
wherein the vertical direction is orthogonal to the first and second directions.

10. A lighting device comprising:
a substrate;
a light source unit disposed on the substrate;
a resin layer disposed on the substrate and covering the light source portion;
a light blocking layer disposed on the resin layer and having an opening portion; and
an optical layer disposed on the light blocking layer,
wherein the opening portions comprise a plurality of first openings arranged with regularity,
wherein light emitted from the light source portion is transmitted to the optical layer through the plurality of first openings and is emitted to an outside through the optical layer,
wherein the light source portion include a plurality of first light sources disposed in a first region of the resin layer and a plurality of second light sources disposed in a second region of the resin layer,
wherein the resin layer includes a groove disposed between the first and second regions,
wherein the resin layer includes first and second side surfaces facing in a second direction, and third and fourth side surfaces facing in a first direction, wherein the first direction is orthogonal to the second direction, and
wherein the plurality of first light sources is disposed between the first side surface of the resin layer and the groove.

11. The lighting device of claim 10,
wherein a number of the plurality of first openings is greater than a number of the plurality of first light sources.

12. The lighting device of claim 11, wherein at least one of the plurality of first openings comprises:
a first unit opening;
a third unit opening spaced apart from the first unit opening in a first direction;
a second unit opening disposed between the first and third unit openings and connecting the first and third unit openings;
wherein a length in the first direction of each of the first to third unit openings are the same as each other,
wherein a length of the second unit opening is greater than a length of the first unit opening and a length of the third unit opening is greater than a length of the second unit opening in a second direction, and
wherein the second direction is a direction orthogonal to the first direction.

13. The lighting device of claim 10, wherein the resin layer comprises a connection portion disposed between the first and second regions and connecting the first and second regions.

14. The lighting device of claim 13, wherein the opening portion comprise a plurality of second openings arranged with regularity,
   wherein the plurality of second openings is disposed in a region corresponding to a region between the plurality of first openings spaced apart in a first direction and a region corresponding to the second direction, and
   wherein the second direction is a direction perpendicular to the first direction.

15. The lighting device of claim 14, comprising a virtual straight line connecting the centers of the plurality of first openings, and
   wherein a length of the second direction between each of the plurality of second openings and the virtual straight line is different from each other.

16. The lighting device of claim 15, wherein a length in the second direction between each of the plurality of second openings and the virtual straight line decreases from a first light source to a last light source among the plurality of second light sources.

17. The lighting device of claim 14, the opening portion further includes a plurality of third openings disposed in a central region of the light blocking layer, and
   wherein the plurality of third openings overlaps the groove in a vertical direction.

18. The lighting device of claim 10, wherein light emitted from the light source portion is transmitted to the optical layer through the opening portion, and a light pattern formed through the optical layer has a linear shape.

19. The lighting device of claim 10, further comprising a reflective layer disposed between the substrate and the resin layer,
   wherein the reflective layer overlaps the opening portion in a vertical direction.

20. The lighting device of claim 10, wherein the opening portion does not overlap the light source portion in a vertical direction.

* * * * *